(12) United States Patent
Kang et al.

(10) Patent No.: US 9,520,361 B2
(45) Date of Patent: Dec. 13, 2016

(54) SEMICONDUCTOR DEVICES

(71) Applicant: Samsung Electronics Co., Ltd., Suwon-si, Gyeonggi-do (KR)

(72) Inventors: Pil-Kyu Kang, Hwaseong-si (KR); Seok-Ho Kim, Hwaseong-si (KR); Tae-Yeong Kim, Suwon-si (KR); Hyo-Ju Kim, Seoul (KR); Byung-Lyul Park, Seoul (KR); Joo-Hee Jang, Hwaseong-si (KR); Jin-Ho Chun, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/937,406

(22) Filed: Nov. 10, 2015

(65) Prior Publication Data
US 2016/0141249 A1 May 19, 2016

(30) Foreign Application Priority Data

Nov. 13, 2014 (KR) ........................ 10-2014-0157836

(51) Int. Cl.
*H01L 23/532* (2006.01)
*H01L 25/065* (2006.01)

(52) U.S. Cl.
CPC ... *H01L 23/53228* (2013.01); *H01L 23/53209* (2013.01); *H01L 23/53214* (2013.01); *H01L 25/0657* (2013.01); *H01L 2924/0002* (2013.01)

(58) Field of Classification Search
CPC ............ H01L 23/532; H01L 23/53228; H01L 23/53214; H01L 23/53209; H01L 25/0657; H01L 25/065
See application file for complete search history.

(56) References Cited

U.S. PATENT DOCUMENTS

| | | | |
|---|---|---|---|
| 7,344,976 B2 | 3/2008 | Yoshida et al. | |
| 7,800,108 B2 | 9/2010 | Nambu | |
| 7,842,540 B2 | 11/2010 | Tong et al. | |
| 8,368,222 B2 | 2/2013 | Okuyama | |
| 8,614,146 B2 | 12/2013 | Takesako et al. | |
| 8,679,971 B2 | 3/2014 | Farooq et al. | |
| 8,704,375 B2 | 4/2014 | Liu et al. | |
| 8,749,066 B2 | 6/2014 | Zhang et al. | |
| 2006/0240597 A1 | 10/2006 | Abe | |
| 2010/0007021 A1 | 1/2010 | Choo et al. | |
| 2010/0187670 A1* | 7/2010 | Lin | H01L 21/76898 257/686 |

(Continued)

FOREIGN PATENT DOCUMENTS

| | | |
|---|---|---|
| JP | 2000-269222 A | 9/2000 |
| KR | 10-2000-0076857 A | 12/2000 |

*Primary Examiner* — Peniel M Gumedzoe
(74) *Attorney, Agent, or Firm* — Myers Bigel, P.A.

(57) ABSTRACT

Semiconductor devices are provided. A semiconductor device includes a substrate, a first conductive structure on the substrate, and a second conductive structure on the first conductive structure. The semiconductor device includes first and second metal-diffusion-blocking layers on respective sidewalls of the first and second conductive structures. The semiconductor device includes an insulating layer between the first and second metal-diffusion-blocking layers. Moreover, the semiconductor device includes a metal-diffusion-shield pattern in the insulating layer and spaced apart from the first conductive structure.

20 Claims, 25 Drawing Sheets

(56) References Cited

U.S. PATENT DOCUMENTS

| | | |
|---|---|---|
| 2012/0094469 A1 | 4/2012 | Landru |
| 2013/0009321 A1* | 1/2013 | Kagawa ............... H01L 23/481 |
| | | 257/774 |
| 2013/0134548 A1 | 5/2013 | Torii |
| 2013/0140680 A1 | 6/2013 | Harada et al. |
| 2014/0011324 A1 | 1/2014 | Liu et al. |
| 2014/0117546 A1 | 5/2014 | Liu et al. |

* cited by examiner

SEMICONDUCTOR DEVICES

CROSS-REFERENCE TO RELATED APPLICATION

This application claims priority under 35 USC §119 to Korean Patent Application No. 10-2014-0157836, filed on Nov. 13, 2014 in the Korean Intellectual Property Office (KIPO), the contents of which are hereby incorporated herein by reference in their entirety.

BACKGROUND

The present disclosure relates to semiconductor devices. To increase the integration degree of a semiconductor device, various techniques for stacking semiconductor chips, semiconductor packages, or substrates have been developed, which can produce a Chip-on-Chip (CoC) structure and/or a Package-on-Package (PO) structure. When two substrates, each having an insulating interlayer containing a conductive pattern therein, are bonded together to form a stacked structure, it may be beneficial for the conductive patterns and the insulating interlayers to be bonded well, so that a semiconductor device including the stacked structure may have good electrical reliability.

SUMMARY

Example embodiments provide semiconductor devices having stacked structures and good electrical reliability.

A semiconductor device, according to various embodiments, may include a first insulating interlayer on a substrate. The semiconductor device may include a first conductive pattern structure in the first insulating interlayer, the first conductive pattern structure protruding upwardly beyond a top surface of the first insulating interlayer. The semiconductor device may include a first diffusion blocking insulation layer on the first insulating interlayer. The first diffusion blocking insulation layer may be on an upper portion of a sidewall of the first conductive pattern structure that protrudes beyond the first insulating interlayer. The semiconductor device may include a first bonding layer on the first diffusion blocking insulation layer. The first bonding layer may be on the upper portion of the sidewall of the first conductive pattern structure that protrudes beyond the first insulating interlayer.

The semiconductor device may include a first shield pattern in the first bonding layer, the first shield pattern being spaced apart from the first conductive pattern structure and surrounding the first conductive pattern structure.

The semiconductor device may further include a second bonding layer on the first bonding layer and the first shield pattern. The semiconductor device may include a second diffusion blocking insulation layer on the second bonding layer. The semiconductor device may include a second insulating interlayer on the second diffusion blocking insulation layer.

The semiconductor device may include a second conductive pattern structure in the second insulating interlayer, the second diffusion blocking insulation layer, and the second bonding layer. The second conductive pattern structure may contact a top surface of the first conductive pattern structure. Moreover, the semiconductor device may include a second shield pattern in the second bonding layer. The second shield pattern may be spaced apart from the second conductive pattern structure and surrounding the second conductive pattern structure.

In various embodiments, the first and second shield patterns may contact each other. In some embodiments, the first conductive pattern structure may include a first barrier layer pattern on sidewalls of the first insulating interlayer, the first diffusion blocking insulation layer, and the first bonding layer, respectively. The first conductive pattern structure may also include a first conductive pattern, where the first barrier layer pattern may be on a sidewall and a bottom surface of the first conductive pattern. The second conductive pattern structure may include a second barrier layer pattern on sidewalls of the second insulating interlayer, the second diffusion blocking insulation layer, and the second bonding layer, respectively. The second conductive pattern structure may also include a second conductive pattern, and the second barrier layer pattern may be on a sidewall and a top surface of the second conductive pattern. In some embodiments, the first and second barrier layer patterns and the first and second shield patterns each may include a metal, a metal nitride, or a metal alloy. Moreover, in some embodiments, each of the first and second conductive patterns may include copper, aluminum, tungsten, and/or nickel.

According to various embodiments, the semiconductor device may include a third insulating interlayer between the substrate and the first insulating interlayer, the third insulating interlayer including a third conductive pattern structure therein that contacts the first conductive pattern structure. Moreover, the semiconductor device may include a fourth insulating interlayer on the second insulating interlayer, the fourth insulating interlayer including a fourth conductive pattern structure therein that contacts the second conductive pattern structure. In some embodiments, the semiconductor device may include first and second etch stop layers. The first etch stop layer is between the first and third insulating interlayers and is on a lower portion of the sidewall of the first conductive pattern structure, and the second etch stop layer is between the second and fourth insulating interlayers and is on an upper portion of a sidewall of the second conductive pattern structure.

In various embodiments, the first conductive pattern structure may contact the second bonding layer, and the second conductive pattern structure may contact the first bonding layer. In some embodiments, the first shield pattern may include a plurality of first shield patterns spaced apart from each other in the first bonding layer, and the second shield pattern may include a plurality of second shield patterns spaced apart from each other in the second bonding layer. Moreover, at least one of the plurality of first shield patterns and at least one of the plurality of second shield patterns may contact each other.

A semiconductor device, according to various embodiments, may include a first insulating interlayer on a substrate. The semiconductor device may include a first conductive connector in the first insulating interlayer, the first conductive connector protruding upwardly beyond a top surface of the first insulating interlayer. The semiconductor device may include a first diffusion blocking layer on the first insulating interlayer. The first diffusion blocking layer may be on an upper portion of a sidewall of the first conductive connector that protrudes beyond the first insulating interlayer.

The semiconductor device may include a first bonding layer on the first diffusion blocking layer. The first bonding layer may be on the upper portion of the sidewall of the first conductive connector that protrudes beyond the first insulating interlayer.

The semiconductor device may include a first shield pattern in the first bonding layer and the first diffusion blocking layer, the first shield pattern being spaced apart from and defining a perimeter around the first conductive connector.

The semiconductor device may include a second bonding layer on the first bonding layer and the first shield pattern. The semiconductor device may include a second diffusion blocking layer on the second bonding layer. The semiconductor device may include a second insulating interlayer on the second diffusion blocking layer. The semiconductor device may include a second conductive connector in the second insulating interlayer, the second diffusion blocking layer, and the second bonding layer. The second conductive connector may contact a top surface of the first conductive connector. Moreover, the semiconductor device may include a second shield pattern in the second bonding layer and the second diffusion blocking layer, the second shield pattern being spaced apart from and defining a perimeter around the second conductive connector.

In various embodiments, the first and second shield patterns may contact each other. In some embodiments, the first conductive connector may contact the second bonding layer, and the second conductive connector may contact the first bonding layer.

According to various embodiments, the first shield pattern may include a plurality of first shield patterns spaced apart from each other in the first bonding layer and the first diffusion blocking layer, and the second shield pattern may include a plurality of second shield patterns spaced apart from each other in the second bonding layer and the second diffusion blocking layer. Moreover, at least one of the plurality of first shield patterns and at least one of the plurality of second shield patterns may contact each other.

A semiconductor device, according to various embodiments, may include a substrate, a first conductive structure on the substrate, and a second conductive structure on the first conductive structure. The semiconductor device may include first and second metal-diffusion-blocking layers on respective sidewalls of the first and second conductive structures. The semiconductor device may include an insulating layer between the first and second metal-diffusion-blocking layers. Moreover, the semiconductor device may include a metal-diffusion-shield pattern in the insulating layer and spaced apart from the first conductive structure.

In various embodiments, the insulating layer may extend under a portion of the second conductive structure. In some embodiments, the first metal-diffusion-blocking layer may extend under the portion of the second conductive structure. In some embodiments, the metal-diffusion-shield pattern may extend from the insulating layer into the first metal-diffusion-blocking layer. Moreover, in some embodiments, the metal-diffusion-shield pattern may include a first metal-diffusion-shield pattern in the insulating layer and a second metal-diffusion-shield pattern that contacts a portion of the first metal-diffusion-shield pattern; the first metal-diffusion-shield pattern, the second metal-diffusion-shield pattern, the first metal-diffusion-blocking layer, and/or the second metal-diffusion-blocking layer may include a nitride. The semiconductor device may include an insulating interlayer on the sidewall of the first conductive structure, and the first metal-diffusion-blocking layer may contact the insulating interlayer and may be between the insulating interlayer and the insulating layer that extends under the portion of the second conductive structure.

In a method of manufacturing a semiconductor device according to various embodiments herein, when substrates having insulating interlayers containing conductive pattern structures therein are bonded with each other, the metal of the conductive pattern structures may not diffuse into the insulating interlayers. Additionally, the diffusion of the metal between neighboring conductive patterns structures may be reduced/prevented by a shield pattern surrounding the conductive pattern structures. Thus, the electrical characteristics of the semiconductor device may not be degraded by the bonding, and the semiconductor device may have good electrical characteristics.

BRIEF DESCRIPTION OF THE DRAWINGS

Example embodiments will be more clearly understood from the following detailed description taken in conjunction with the accompanying drawings.

FIG. 1 is a cross-sectional view illustrating a semiconductor device in accordance with some example embodiments;

FIG. 2 is a cross-sectional view illustrating a semiconductor device in accordance with a comparative example;

FIGS. 3 to 6 and FIGS. 8 to 9 are cross-sectional views illustrating stages of a method of manufacturing the semiconductor device in FIG. 1;

FIG. 7 is a plan view illustrating the semiconductor device in FIG. 6;

FIG. 10 is a cross-sectional view illustrating a semiconductor device in accordance with some example embodiments;

FIGS. 11 to 14 are cross-sectional views illustrating stages of a method of manufacturing the semiconductor device in FIG. 10;

FIG. 15 is a cross-sectional view illustrating a semiconductor device in accordance with some example embodiments;

FIG. 16 is a cross-sectional view illustrating a semiconductor device in accordance with a comparative example;

FIGS. 17 to 19 and FIG. 21 are cross-sectional views illustrating stages of a method of manufacturing the semiconductor device in FIG. 15;

FIG. 20 is a plan view illustrating the semiconductor device in FIG. 19;

FIG. 22 is a cross-sectional view illustrating a semiconductor device in accordance with some example embodiments; and FIGS. 23 to 33 are cross-sectional views illustrating stages of a method of manufacturing the semiconductor device in FIG. 22.

DETAILED DESCRIPTION

Figure 1:
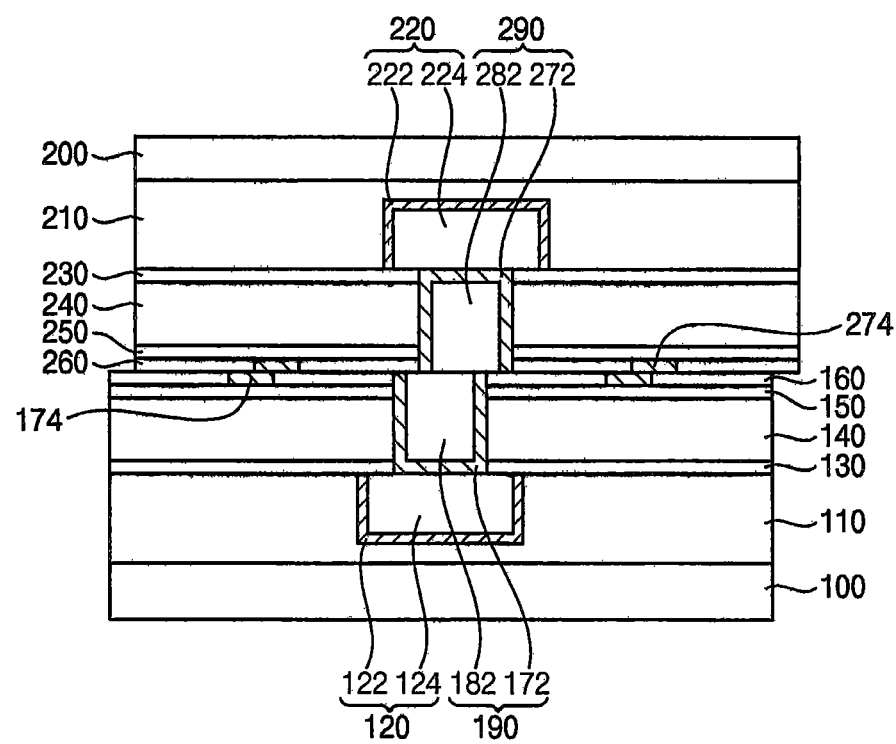
FIGS. 1 to 33 represent non-limiting, example embodiments as described herein.

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout the description.

The terminology used herein is for the purpose of describing particular embodiments only and is not intended to be limiting of the embodiments. As used herein, the singular forms "a," "an," and "the" are intended to include the plural forms as well, unless the context clearly indicates otherwise.

It will be further understood that the terms "comprises," "comprising," "includes," and/or "including," when used in this specification, specify the presence of the stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein the term "and/or" includes any and all combinations of one or more of the associated listed items.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein may be interpreted accordingly.

Example embodiments of present inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of present inventive concepts should not be construed as limited to the particular shapes of regions illustrated herein but are to include deviations in shapes that result, for example, from manufacturing. Accordingly, the regions illustrated in the figures are schematic in nature and their shapes are not intended to illustrate the actual shape of a region of a device and are not intended to limit the scope of example embodiments.

It will be understood that although the terms "first," "second," etc. may be used herein to describe various elements, these elements should not be limited by these terms. These terms are only used to distinguish one element from another. Thus, a "first" element could be termed a "second" element without departing from the teachings of the present embodiments.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Figure 2:
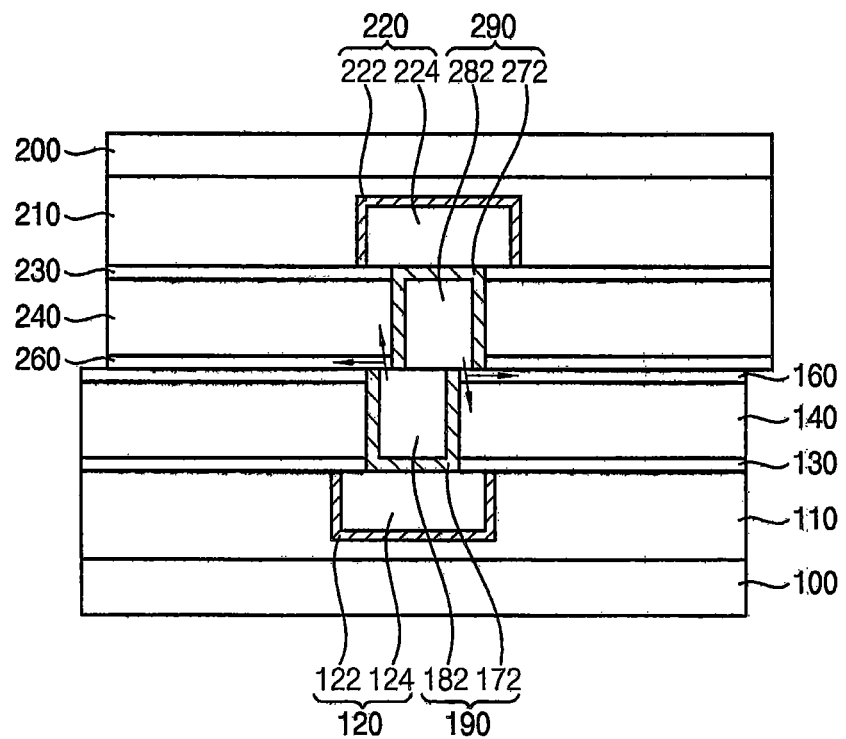

FIG. 1 is a cross-sectional view illustrating a semiconductor device in accordance with some example embodiments. FIG. 2 is a cross-sectional view illustrating a semiconductor device in accordance with a comparative example (e.g., a comparison with FIG. 1).

Referring to FIG. 1, the semiconductor may include a first insulating interlayer 140 on a first substrate 100, a first conductive pattern structure 190, a first diffusion blocking insulation layer 150 on the first insulating interlayer 140, a first bonding insulating layer 160 on the first diffusion blocking insulation layer 150, a first shield pattern 174 through the first bonding insulating layer 160, a second bonding insulating layer 260 on the first bonding insulating layer 160 and the first shield pattern 174, a second diffusion blocking insulation layer 250 on the second bonding insulating layer 260, a second insulating interlayer 240 on the second diffusion blocking insulation layer 250, a second conductive pattern structure 290, and a second shield pattern 274 through the second bonding insulating layer 260. The first conductive pattern structure 190 may be partially contained by the first insulating interlayer 140 and protrude upwardly beyond a top surface of the first insulating interlayer 140. The first diffusion blocking insulation layer 150 may be on a portion of an upper sidewall of the first conductive pattern structure 190. The first conductive pattern structure 190 protrudes beyond the top surface of the first insulating interlayer 140. In particular, the portion of the upper sidewall of the first conductive pattern structure 190 that the first diffusion blocking insulation layer 150 is on protrudes beyond the top surface of the first insulating interlayer 140. The first bonding insulating layer 160 may be on a portion of the upper sidewall of the first conductive pattern structure 190 that protrudes beyond the first diffusion blocking insulation layer 150. The first shield pattern 174 may be spaced apart from the first conductive pattern structure 190, and may surround (e.g., define a perimeter around) the first conductive pattern structure 190. The second conductive pattern structure 290 may be formed through the second insulating interlayer 240, the second diffusion blocking insulation layer 250, and the second bonding insulating layer 260, and may contact a top surface of the first conductive pattern structure 190. The second shield pattern 274 may be spaced apart from the second conductive pattern structure 290, and may surround (e.g., define a perimeter around) the second conductive pattern structure 290.

In some example embodiments, the semiconductor device may further include a third insulating interlayer 110 between the first substrate 100 and the first insulating interlayer 140, and a fourth insulating interlayer 210 on the second insulating interlayer 240. The third insulating interlayer 110 may contain a third conductive pattern structure 120 that contacts the first conductive pattern structure 190, and the fourth insulating interlayer 210 may contain a fourth conductive pattern structure 220 that contacts the second conductive pattern structure 290.

In some example embodiments, the semiconductor device may further include a first etch stop layer 130 between the first and third insulating interlayers 140 and 110, and a second etch stop layer 230 between the second and fourth insulating interlayers 240 and 210. The first etch stop layer 130 may be on a lower sidewall of the first conductive pattern structure 190, and the second etch stop layer 230 may be on an upper sidewall of the second conductive pattern structure 290. For example, each of the first and second etch stop layers 130 and 230 may include silicon nitride, silicon carbonitride, silicon carbide, and/or silicon oxynitride.

In some example embodiments, the semiconductor device may further include a second substrate 200 on the fourth insulating interlayer 210, if desired/needed. The second substrate 200 may include a material that is substantially the same as that of the first substrate 100. The second substrate 200 may include a semiconductor material, e.g., silicon, germanium, silicon-germanium, or the like. Alternatively, the second substrate 200 may include a compound semiconductor, e.g., silicon carbide, gallium arsenide, gallium phosphate, indium phosphate, indium arsenide, indium antimonide, or the like, or glass.

The first to fourth insulating interlayers 140, 240, 110, and 210 may include an insulating material, e.g., silicon oxide, a low-k dielectric material, or the like.

In some example embodiments, the first conductive pattern structure 190 may include a first conductive pattern 182 and a first barrier layer pattern 172. The first barrier layer pattern 172 may cover a bottom surface and a sidewall of the first conductive pattern 182. The first barrier layer pattern 172 may contact a top surface of the third conductive pattern structure 120, and may contact inner sidewalls of the first insulating interlayer 140, the first diffusion blocking insulation layer 150, and the first bonding insulating layer 160.

The second conductive pattern structure 290 may include a second conductive pattern 282 and a second barrier layer pattern 272. The second barrier layer pattern 272 may cover a top surface and a sidewall of the second conductive pattern 282. The second barrier layer pattern 272 may contact a bottom surface of the fourth conductive pattern structure 220, and may contact inner sidewalls of the second insulating interlayer 240, the second diffusion blocking insulation layer 250, and the second bonding insulating layer 260.

In some example embodiments, the third conductive pattern structure 120 may include a third conductive pattern 124 and a third barrier layer pattern 122. The third barrier layer pattern 122 may cover a bottom surface and a sidewall of the third conductive pattern 124. The fourth conductive pattern structure 220 may include a fourth conductive pattern 224 and a fourth barrier layer pattern 222. The fourth barrier layer pattern 222 may cover a top surface and a sidewall of the fourth conductive pattern 224. The third conductive pattern structure 120 may be electrically connected to the first substrate 100 by a contact plug, and the fourth conductive pattern 220 may be electrically connected to the second substrate 200 by a contact plug.

In some example embodiments, the first to fourth barrier layer patterns 172, 272, 122, and 222 may include substantially the same material. The first to fourth barrier layer patterns 172, 272, 122, and 222 may include a metal, e.g., titanium, tantalum, tungsten, ruthenium, cobalt, nickel, or the like, a metal nitride, e.g., titanium nitride, tantalum nitride, tungsten nitride, titanium zirconium nitride, titanium silicon nitride, tantalum aluminum nitride, tantalum silicon nitride, or the like, or a metal alloy, e.g., titanium tungsten.

In some example embodiments, the first to fourth conductive patterns 182, 282, 124, and 224 may include substantially the same material. The first to fourth conductive patterns 182, 282, 124, and 224 may include a metal, e.g., copper, aluminum, tungsten, nickel, or the like.

The first to fourth conductive patterns 182, 282, 124, and 224 and the first to fourth barrier layer patterns 172, 272, 122, and 222 may have a single layer structure or a multi-layered structure.

The first bonding insulating layer 160 may be formed between the first diffusion blocking insulation layer 150 and the second bonding insulating layer 260, and may be on an upper sidewall of the first conductive pattern structure 190. The second bonding insulating layer 260 may be formed between the first bonding insulating layer 160 and the second diffusion blocking insulation layer 250, and may be on a lower sidewall of the second conductive pattern structure 290. The first and second bonding insulating layers 160 and 260 may contact each other.

In some example embodiments, the semiconductor device may be formed by bonding the first and second substrates 100 and 200 with each other so that the first and second conductive pattern structures 190 and 290 may be aligned with each other. However, in some embodiments, when the first and second substrates 100 and 200 are bonded with each other, the first and second conductive pattern structures 190 and 290 may be misaligned, which is illustrated in FIG. 1. In this case, the first and second bonding insulating layers 160 and 260 may contact the second and first conductive pattern structures 290 and 190, respectively.

In some example embodiments, the first and second bonding insulating layers 160 and 260 may include substantially the same material, and thus may be merged into each other. The first and second bonding insulating layers 160 and 260 may include silicon carbonitride or silicon oxide.

In processes for forming the semiconductor device, when the first and second substrates 100 and 200 are bonded with each other so that the first and second bonding insulating layers 160 and 260 may contact each other, the first and second bonding insulating layers 160 and 260 at uppermost levels on the first and second substrates 100 and 200, respectively, may be damaged during a process of forming an opening for the first and second conductive pattern structures 190 and 290 and/or a process for performing a plasma treatment on an interface therebetween. Thus, when the first and second substrates 100 and 200 are bonded with each other, the metal of the first and second conductive pattern structures 190 and 290 may diffuse through the first and second bonding insulating layers 160 and 260.

As illustrated in FIG. 2, when the first and second conductive pattern structures 190 and 290 are not aligned with each other, the metal of the first and second conductive pattern structures 190 and 290 may diffuse into the second and first insulating interlayers 240 and 140, respectively, or into neighboring conductive pattern structures through the second and first bonding insulating layers 260 and 160, respectively. Accordingly, the semiconductor device may have poor electrical characteristics and poor reliability.

However, as shown in FIG. 1, in the semiconductor device in accordance with some example embodiments, the diffusion of metal may be reduced/prevented, even though the first and second conductive pattern structures 190 and 290 may be misaligned with each other. Particularly, the first diffusion blocking insulation layer 150 between the first bonding insulating layer 160 and the first insulating interlayer 140 may reduce/prevent the diffusion of the metal to the first insulating interlayer 140. The second diffusion blocking insulation layer 250 between the second bonding insulating layer 260 and the second insulating interlayer 240 may reduce/prevent the diffusion of the metal to the second insulating interlayer 240. The first and second shield patterns 174 and 274 may reduce/prevent the diffusion of the metal to neighboring conductive pattern structures through the first and second bonding insulating layers 160 and 260, respectively. Accordingly, electrical characteristics of the semiconductor device may not be deteriorated.

In some example embodiments, the first and second diffusion blocking insulation layers 150 and 250 may include substantially the same material. The first and second diffusion blocking insulation layers 150 and 250 may include a nitride, e.g., silicon nitride.

In some example embodiments, the first and second shield patterns 174 and 274 may contact each other. The first and second shield patterns 174 and 274 may reduce/prevent the diffusion of the metal of the first and second conductive pattern structures 190 and 290. In contrast, when the first and second shield patterns 174 and 274 do not contact each other, the metal may diffuse through a space between the first and second shield patterns 174 and 274. Thus, each of the first and second shield patterns 174 and 274 may have a sufficient width to contact each other, even though the first and second conductive pattern structures 190 and 290 may be misaligned with each other.

In some example embodiments, the first and second shield, patterns 174 and 274, and the first and second barrier layer patterns 172 and 272 may include substantially the same material. The first and second shield patterns 174 and 274 may include a metal, e.g., titanium, tantalum, tungsten, ruthenium, cobalt, nickel, or the like, a metal nitride, e.g., titanium nitride, tantalum nitride, tungsten nitride, titanium zirconium nitride, titanium silicon nitride, tantalum aluminum nitride, tantalum silicon nitride, or the like, or a metal alloy, e.g., titanium tungsten.

As discussed above, in a semiconductor device in accordance with some example embodiments, the diffusion of metal of the first and second conductive pattern structures 190 and 290 may be reduced/prevented by the first and second shield patterns 174 and 274, and the first and second diffusion blocking insulation layers 150 and 250, even though the first and second conductive pattern structures 190 and 290 may be misaligned with each other. Accordingly, the semiconductor device may have good electrical characteristics and good reliability.

When the first and second conductive pattern structures 190 and 290 are aligned well, however, the metal of the first and second conductive pattern structures 190 and 290 may not diffuse into the second and first insulating interlayers 240 and 140 even without the first and second diffusion blocking insulation layers 150 and 250. Additionally, the metal of the first and second conductive pattern structures 190 and 290 may not diffuse into the conductive pattern structures adjacent to the first and second conductive pattern structures 190 and 290 even without the first and second shield patterns 174 and 274.

However, in some example embodiments, even though the first and second conductive pattern structures 190 and 290 may be misaligned with each other, the diffusion of the metal of the first and second conductive pattern structures 190 and 29Q to the second and first insulating interlayers 240 and 140 through the first and second shield patterns 174 and 274 and the first and second diffusion blocking insulation layers 150 and 250 may be reduced/prevented.

FIGS. 3 to 6 and FIGS. 8 to 9 are cross-sectional views illustrating stages of a method of manufacturing a semiconductor device in FIG. 1. FIG. 7 is a plan view illustrating the semiconductor device of FIG. 6.

Figure 3:
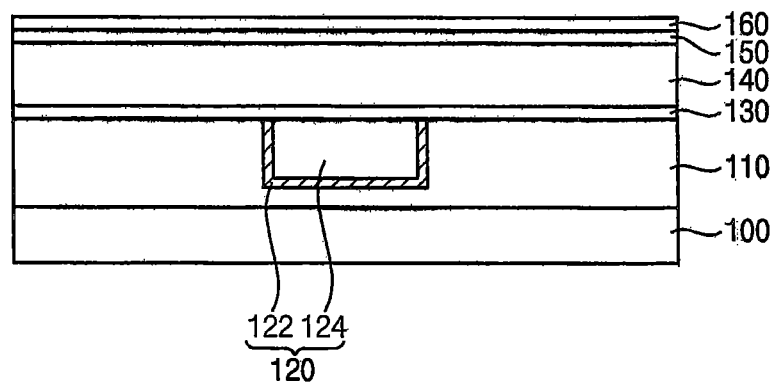

Referring to FIG. 3, a third insulating interlayer 110 containing a third conductive pattern structure 120 therein may be formed on a first substrate 100. A first etch stop layer 130, a first insulating interlayer 140, a first diffusion blocking insulation layer 150, and a first bonding insulating layer 160 may be sequentially formed on the third insulating interlayer 110.

The first substrate 100 may include a semiconductor material, e.g., silicon, germanium, silicon-germanium, or the like. Alternatively, the first substrate 100 may include a compound semiconductor, e.g., silicon carbide, gallium arsenide, gallium phosphate, indium phosphate, indium arsenide, indium antimonide, or the like, or glass.

The third insulating interlayer 110 may be formed of a nitride, e.g., silicon nitride, or a low-k dielectric material.

In some example embodiments, a recess may be formed on the third insulating interlayer 110, a third barrier layer may be formed on/in an inner wall of the recess and a top surface of the third insulating interlayer 110, a third conductive layer may be formed on the third barrier layer to sufficiently fill a remaining portion of the recess, and the third conductive layer and the third barrier layer may be planarized until the top surface of the third insulating interlayer 110 may be exposed. Thus, a third conductive pattern structure 120 may be formed to include a third conductive pattern 124 and a third barrier layer pattern 122 covering a bottom and a sidewall of the third conductive pattern 124. The third barrier layer pattern 122 may be formed on the inner wall of the recess, and the third conductive pattern 124 may fill the remaining portion of the recess.

The third conductive layer may be formed of a metal, e.g., copper, aluminum, tungsten, nickel, or the like. The third barrier layer may be formed of a metal, e.g., titanium, tantalum, tungsten, ruthenium, cobalt, nickel, or the like, a metal nitride, e.g., titanium nitride, tantalum nitride, tungsten nitride, titanium zirconium nitride, titanium silicon nitride, tantalum aluminum nitride, tantalum silicon nitride, or the like, or a metal alloy, e.g., titanium tungsten.

The third conductive pattern 124 and the third barrier layer pattern 122 may be formed to have a single layer structure or a multi-layered structure.

The first etch stop layer 130 may be formed of a nitride, e.g., silicon nitride, silicon carbonitride, silicon oxynitride, or the like, or a carbide, e.g., silicon carbide, or the like. In some embodiments, the first etch stop layer 130 may not be formed (e.g., may be omitted).

The first insulating interlayer 140 may be formed of an oxide, e.g., silicon oxide, or a low-k dielectric material. In some example embodiments, the first insulating interlayer 140 may be formed of a material substantially the same as that of the third insulating interlayer 110.

Figure 4:
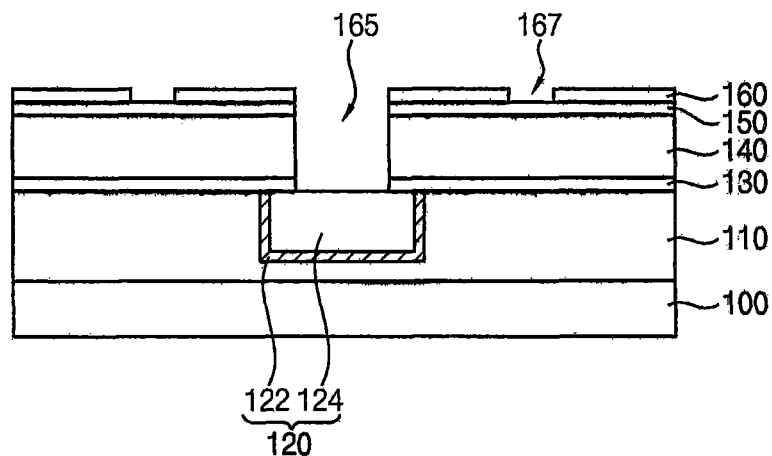

Referring to FIG. 4, a first opening 165 may be formed through the first bonding insulating layer 160, the first diffusion blocking insulation layer 150, the first insulating interlayer 140, and the first etch stop layer 130, and a second opening 167 may be formed through the first bonding insulating layer 160 to surround the first opening 165.

When the first and second openings 165 and 167 are formed, the first bonding insulating layer 160 at an uppermost level may be damaged. Thus, the metal of the first and second conductive pattern structures 190 and 290 may diffuse through the first bonding insulating layer 160. However, the first diffusion blocking insulation layer 150 may not be damaged, and thus the diffusion of the metal into the first insulating interlayer 140 may be reduced/prevented.

In some example embodiments, the first opening 165 may be formed to expose at least a top surface of the third conductive pattern 124 of the third conductive pattern structure 120.

Figure 5:
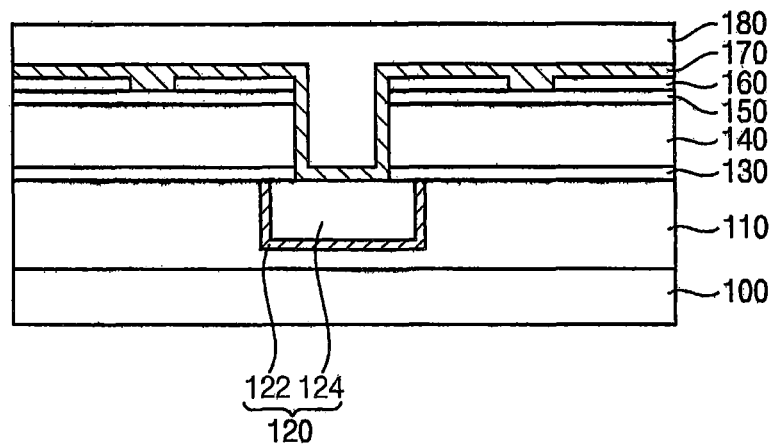

Referring to FIG. 5, a first barrier layer 170 may be formed on the exposed top surface of the third conductive pattern structure 120, a sidewall of the first opening 165 and the first bonding insulating layer 160 to sufficiently fill the second opening 167, and a first conductive layer 180 may be formed on the first barrier layer 170 to sufficiently fill a remaining portion of the first opening 165.

The first barrier layer 170 may be formed of a metal, e.g., titanium, tantalum, tungsten, ruthenium, cobalt, nickel, or the like, a metal nitride, e.g., titanium nitride, tantalum nitride, tungsten nitride, titanium zirconium nitride, titanium silicon nitride, tantalum aluminum nitride, tantalum silicon nitride, or the like, or a metal alloy, e.g., titanium tungsten, or the like. In some example embodiments, the first barrier layer 170 may be formed of a material substantially the same as that of the third barrier layer pattern 122.

In some example embodiments, the first conductive layer 180 may be formed of a material substantially the same as that of the third conductive pattern 124. The first conductive layer 180 may be formed of a metal, e.g., copper, aluminum, tungsten, nickel, or the like. The first conductive layer 180 may be formed by an electroplating process or an electroless plating process.

Figure 6:
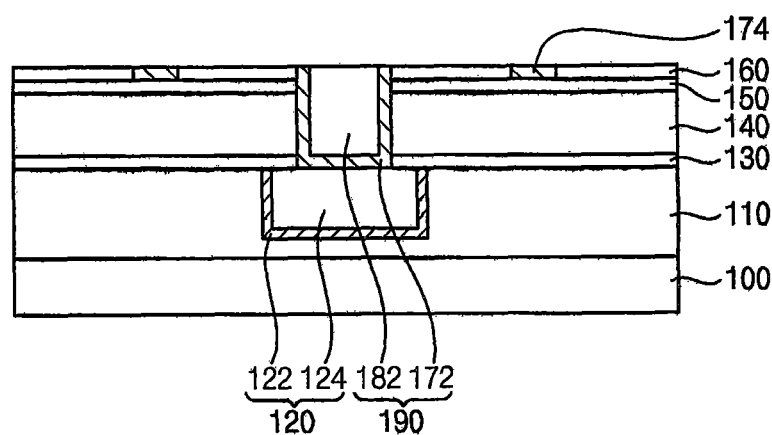
Figure 7:
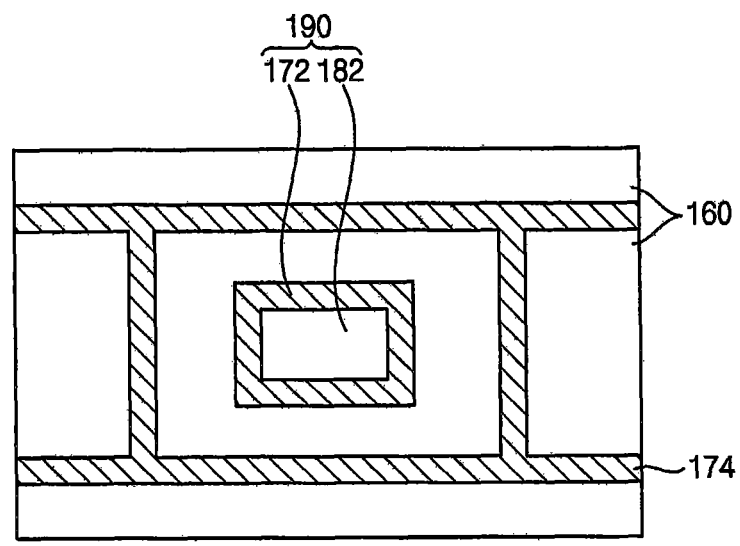

Referring to FIG. 6, the first conductive layer 180 and the first barrier layer 170 may be planarized until a top surface of the first insulating interlayer 160 may be exposed to form the first conductive pattern structure 190 and a first shield pattern 174. The first conductive pattern structure 190 may include a first conductive pattern 182 and the first barrier layer pattern 172, and the first shield pattern 174 may surround the first conductive pattern structure 190. For example, the planarization process may include a chemical mechanical polishing (CMP) process.

Referring to FIG. 7, in some example embodiments, the first shield pattern 174 may be formed to be spaced apart from the first conductive pattern structure 190 and surround the first conductive pattern structure 190. Accordingly, the diffusion of the metal of the conductive patterns may be reduced/prevented between the first conductive pattern structure 190 and conductive pattern structures adjacent to the first conductive pattern structure 190.

Figure 8:
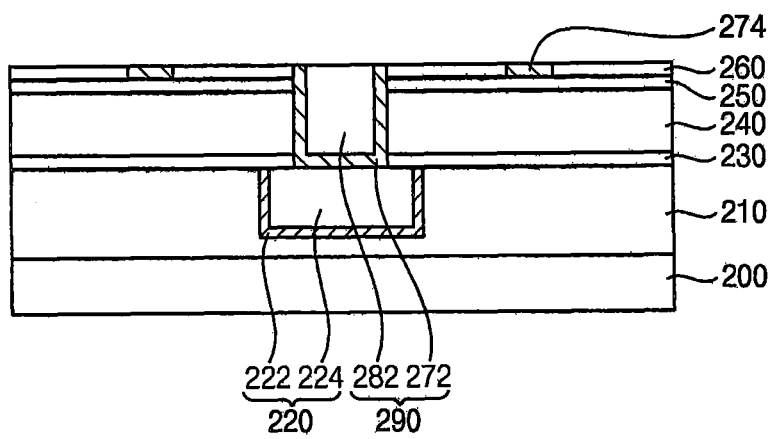

Referring to FIG. 8, processes substantially the same as or similar to those illustrated with reference to FIGS. 3 to 7 may be performed, so that fourth and second insulating interlayers 210 and 240 may be sequentially stacked on a second substrate 200, and fourth and second conductive pattern structures 220 and 290 may be formed. The fourth and second conductive pattern structures 220 and 290 may be contained in the fourth and second insulating interlayers 210 and 240, respectively. A second diffusion blocking insulation layer 250 and a second bonding insulating layer 260 may be sequentially formed on the second insulating interlayer 240 to cover an upper portion of a sidewall of the second conductive pattern structure 290. A second shield pattern 274 may be formed through the second bonding insulating layer 260 to surround the second conductive pattern structure 290.

The second substrate 200 may be formed of a material substantially the same as that of the first substrate 100. Each of the second and fourth insulating interlayers 240 and 210 may be formed of an oxide, e.g., silicon oxide, or a low-k dielectric material. In some example embodiments, the second and fourth insulating interlayers 240 and 210 may be formed of a material substantially the same as that of the first and third insulating interlayers 140 and 110.

In some example embodiments, a second etch stop layer 230 may be further formed between the second insulating interlayer 240 and the fourth insulating interlayer 210 to include a nitride, e.g., silicon nitride, silicon carbonitride, silicon oxynitride, or the like, or a carbide, e.g., silicon carbide.

The second conductive pattern structure 290 may be formed to include a second conductive pattern 282 and a second barrier layer pattern 272. A sidewall and bottom of the second conductive pattern 282 may be covered by the second barrier layer pattern 272. The fourth conductive pattern structure 220 may be formed to include a fourth conductive pattern 224 and a fourth barrier layer pattern 222. A sidewall and bottom of the fourth conductive pattern 224 may be covered by the fourth barrier layer pattern 222. The second and fourth conductive layer patterns 282 and 224 may be formed of a metal, e.g., copper, aluminum, tungsten, nickel, or the like, and the second and fourth barrier layer patterns 272 and 222 may be formed of a metal, a metal nitride, and/or a metal alloy.

In some example embodiments, the second diffusion blocking insulation layer 250 may be formed of a material substantially the same as that of the first diffusion blocking insulation interlayer 150, e.g., silicon nitride.

In some example embodiments, the second bonding insulating layer 260 may be formed of a material substantially the same as that of the first bonding insulating layer 160. Each of the first and second bonding insulating layers 160 and 260 may include silicon carbonitride or silicon oxide.

The second shield pattern 274 may be formed to be spaced apart from the second conductive pattern structure 290, and surround the second conductive pattern structure 290. Accordingly, the diffusion of the metal between the second conductive pattern structure 290 and conductive pattern structures adjacent to the second conductive pattern structure 290 may be reduced/prevented by the second shield pattern 274.

Figure 9:
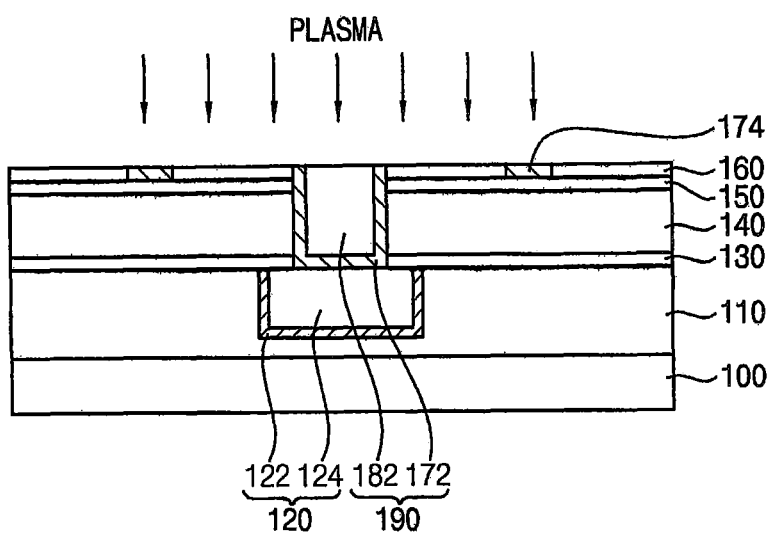

Referring to FIG. 9, a plasma treatment may be performed on at least one of the first and second substrates 100 and 200 having the first and second conductive pattern structures 190 and 290 thereon, respectively.

In some example embodiments, the plasma treatment may be performed using, e.g., nitrogen plasma, oxygen plasma, hydrogen plasma, mixed plasma including nitrogen and hydrogen, tetrafluoromethane (CF4) plasma, and/or ammonia plasma. The plasma treatment may be performed using a capacitively coupled plasma source or an inductively coupled plasma source.

When the plasma treatment is performed, the first bonding insulating layer 160 or the second bonding insulating layer 260 may be damaged at an uppermost level. Thus, the metal of the first and second conductive pattern structures 190 and 290 may diffuse into conductive pattern structures adjacent to the first and second conductive pattern structures 190 and 290 through the first and second bonding insulating layers 160 and 260.

However, as illustrated in FIG. 7, the first shield pattern 174 may be formed to be spaced apart from the first conductive pattern structure 190, and surround the first conductive pattern structure 190. Accordingly, the diffusion of the metal between the first and second conductive pattern structures 190 and 290 and conductive pattern structures adjacent to the first and second conductive pattern structures 190 and 290 may be reduced/prevented.

Referring again to FIG. 1, the first and second substrates 100 and 200 may be bonded with each other so that the first and second conductive pattern structures 190 and 290 may contact each other.

In some example embodiments, after overturning the second substrate 200, the first and second substrates 100 and 200 may be bonded with each other at a high temperature. Hereinafter, a top surface of the second substrate 200 in FIG. 8 may be referred to as a bottom surface of the second substrate 200 in FIG. 1, and a bottom surface of the second substrate 200 in FIG. 8 may be referred to as a top surface of the second substrate 200 in FIG. 1.

The first and second substrates 100 and 200 may be bonded with each other so that the first and second conductive pattern structures 190 and 290 may be aligned with each other. However, in some embodiments, when the first and second substrates 100 and 200 are bonded with each other, the first and second conductive pattern structures 190 and 290 may be misaligned, which is illustrated in FIG. 1.

In some example embodiments, the first and second substrates 100 and 200 may be bonded with each other so that the first and second shield pattern 174 and 274 may contact each other. Accordingly, the diffusion of the metal of the first and second conductive pattern structures 190 and 290 to conductive pattern structures adjacent to the first and second conductive pattern structures 190 and 290 through the first and second bonding insulating layers 160 and 260 may be reduced/prevented.

The second substrate 200 may be removed/omitted, if desired/needed.

As described above, in the method of manufacturing the semiconductor device in accordance with some example embodiments, the first and second diffusion blocking insulation layers 150 and 250, and the first and second shield patterns 174 and 274, may be formed. Accordingly, when the first and second substrates 100 and 200 having the first and second conductive pattern structures 190 and 290 are bonded with each other, even though the first and second conductive pattern structures 19Q and 290 may be misaligned with each other, the diffusion of the metal of the first and second conductive pattern structures 190 and 290 may be reduced/prevented. Thus, the semiconductor device may have good electrical characteristics and good reliability.

Figure 10:
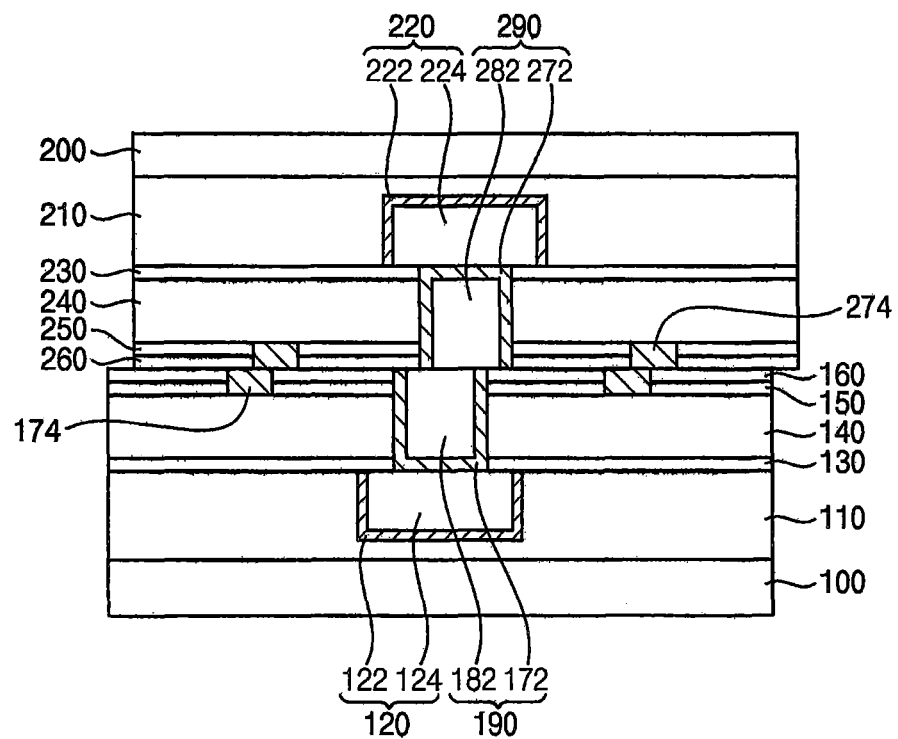

FIG. 10 is a cross-sectional view illustrating a semiconductor device in accordance with some example embodiments. The semiconductor device in FIG. 10 may be substantially the same as or similar to that illustrated with reference to FIG. 1 except for the shapes of the first and second shield patterns 174 and 274. Thus, like reference numerals refer to like elements, and detailed descriptions thereon may be omitted below in the interest of brevity.

Referring to FIG. 10, the first shield pattern 174 may be formed through the first bonding insulating layer 160 and the first diffusion blocking insulation layer 150, and surround the first conductive pattern 190. A top surface of the first shield pattern 174 may contact the second shield pattern 274 and the second bonding insulating layer 260.

The second shield pattern 274 may be formed through the second diffusion blocking insulation layer 250 and the second bonding insulating layer 260, and surround the second conductive pattern 290. A top surface of the second shield pattern 274 may contact the first shield pattern 174 and the first bonding insulating layer 160.

The first and second shield patterns 174 and 274 may contact each other to reduce/prevent the diffusion of the metal of the first and second conductive pattern structures 190 and 290. Thus, each of the first and second shield patterns 174 and 274 may have a sufficient width to reduce/prevent the diffusion of the metal, even though the first and second conductive pattern structures 190 and 290 may be misaligned with each other.

Further, the diffusion of the metal through the first and second diffusion blocking insulation layers 150 and 250 may be reduced/prevented by the shield pattern 174 through the first bonding insulating layer 160 and the first diffusion blocking insulation layer 150, and the second pattern 274 through the second bonding insulating layer 260 and the second diffusion blocking insulation layer 250.

FIGS. 11 to 14 are cross-sectional views illustrating stages of a method of manufacturing the semiconductor device in FIG. 10. This method may be substantially the same as or similar to that illustrated with reference to FIGS. 3 to 9 except for the shape of the first and second shield patterns 174 and 274. Thus, like reference numerals refer to like elements, and detailed descriptions thereon may be omitted below in the interest of brevity.

First, processes substantially the same as or similar to those illustrated with reference to FIG. 3 may be performed.

Figure 11:
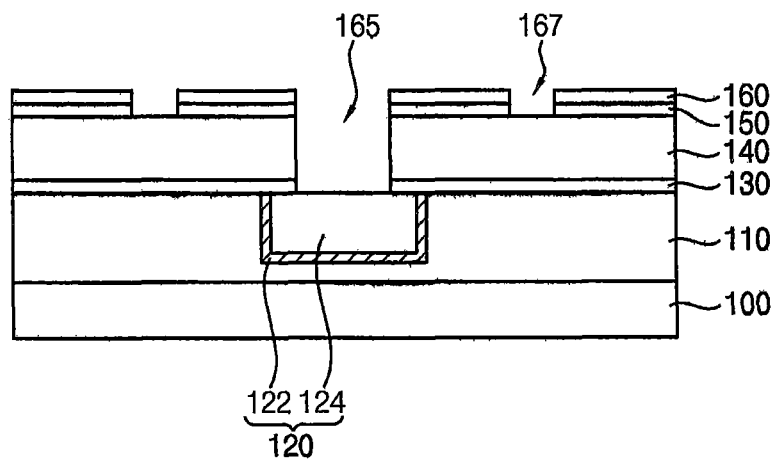

Referring to FIG. 11, a first opening 165 may be formed through the first bonding insulating layer 160, the first diffusion blocking insulation layer 150, the first insulating interlayer 140, and the first etch stop layer 130. A second opening 167 may be formed through the first bonding insulating layer 160 and the first diffusion blocking insulation layer 150 to surround the first opening 165.

In some example embodiments, the first opening 165 may be formed to expose at least a top surface of the third conductive pattern 124 of the third conductive pattern structure 120.

Figure 12:
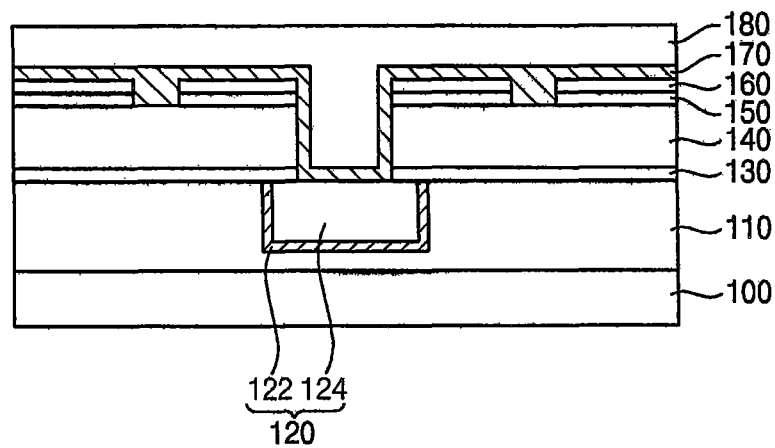

Referring to FIG. 12, a first barrier layer 170 may be formed on the exposed top surface of the third conductive pattern structure 120, a sidewall of the first opening 165, and the first bonding insulating layer 160 and the first diffusion blocking insulation layer 150 to substantially/sufficiently fill the second opening 167. A first conductive layer 180 may be formed on the first barrier layer 170 to sufficiently fill a remaining portion of the first opening 165.

In some example embodiments, the first barrier layer 170 may be formed of a material substantially the same as that of a third barrier layer pattern 122, and the first conductive layer 180 may be formed of a material substantially the same as that of a third conductive pattern 124.

Figure 13:
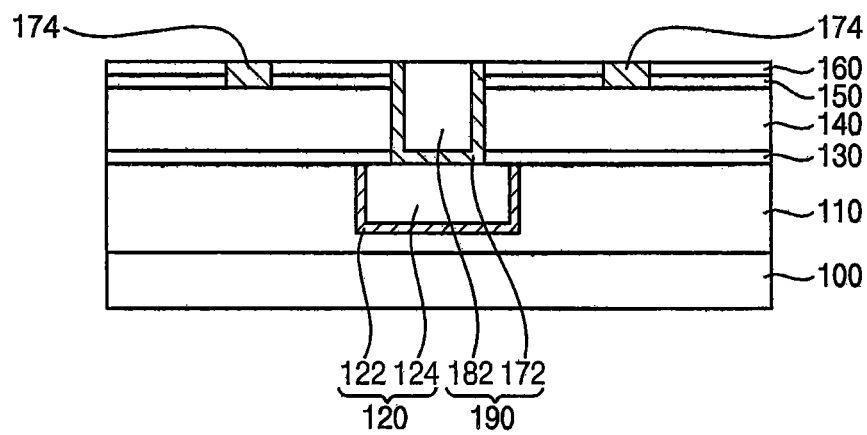

Referring to FIG. 13, the first conductive layer 180 and the first barrier layer 170 may be planarized until a top surface of the first insulating interlayer 160 may be exposed to form a first conductive pattern structure 190 and a first shield pattern 174. The first conductive pattern structure 190 may include a first conductive pattern 182 and a first barrier layer pattern 172, and the first shield pattern 174 may surround the first conductive pattern structure 190. For example, the planarization process may be performed by a CMP process.

Figure 14:
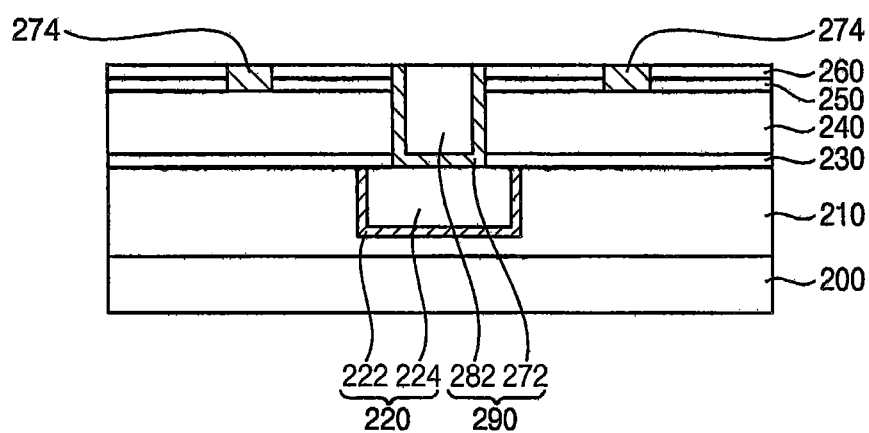

Referring to FIG. 14, processes substantially the same as or similar to those illustrated with reference to FIGS. 11 to 13 may be performed, so that fourth and second insulating interlayers 210 and 240, and fourth and second conductive pattern structures 220 and 290 may be formed. The fourth and second insulating interlayers 210 and 240 may be sequentially stacked on the second substrate 200. The fourth and second conductive pattern structures 220 and 290 may be contained in the fourth and second insulating interlayers 210 and 240, respectively. A second diffusion blocking insulation layer 250 and a second bonding insulating layer 260 may be sequentially formed on the second insulating interlayer 240 to cover an upper portion of a sidewall of the second conductive pattern structure 290. A second shield pattern 274 may be formed through the second bonding insulating layer 260 and the second diffusion blocking insulation layer 25Q to surround the second conductive pattern structure 290.

In some example embodiments, a second etch stop layer 230 may be further formed between the second insulating interlayer 240 and the fourth insulating interlayer 210.

Similar to the process illustrated with reference to FIG. 9, a plasma treatment may be performed on at least one of the first and second substrates 100 and 200 having the first and second conductive pattern structures 190 and 290 thereon, respectively.

Referring again to FIG. 10, the first and second substrates 100 and 200 may be bonded with each other so that the first and second conductive pattern structures 190 and 290 may contact each other. Thus, the semiconductor device may be completed.

As described above, in the method of manufacturing the semiconductor device in accordance with some example embodiments, the first and second diffusion blocking insulation layers 150 and 250, and the first and second shield patterns 174 and 274 may be formed. Accordingly, when the first and second substrates 100 and 200 having the first and second conductive pattern structures 190 and 290, respectively, are bonded with each other, even though the first and second conductive pattern structures 190 and 290 may be misaligned with each other, the diffusion of the metal of the first and second conductive pattern structures 190 and 290 may be reduced/prevented. Further, the first shield pattern 174 may be formed through both the first bonding insulating layer 160 and the first diffusion blocking insulation layer 150, and the second shield pattern 274 may be formed through both the second bonding insulating layer 260 and the second diffusion blocking insulation layer 250. Accordingly, the diffusion of the metal through the first and second diffusion blocking insulation layers 150 and 25Q may be reduced/prevented. Thus, the semiconductor device may have good electrical characteristics and good reliability.

Figure 15:
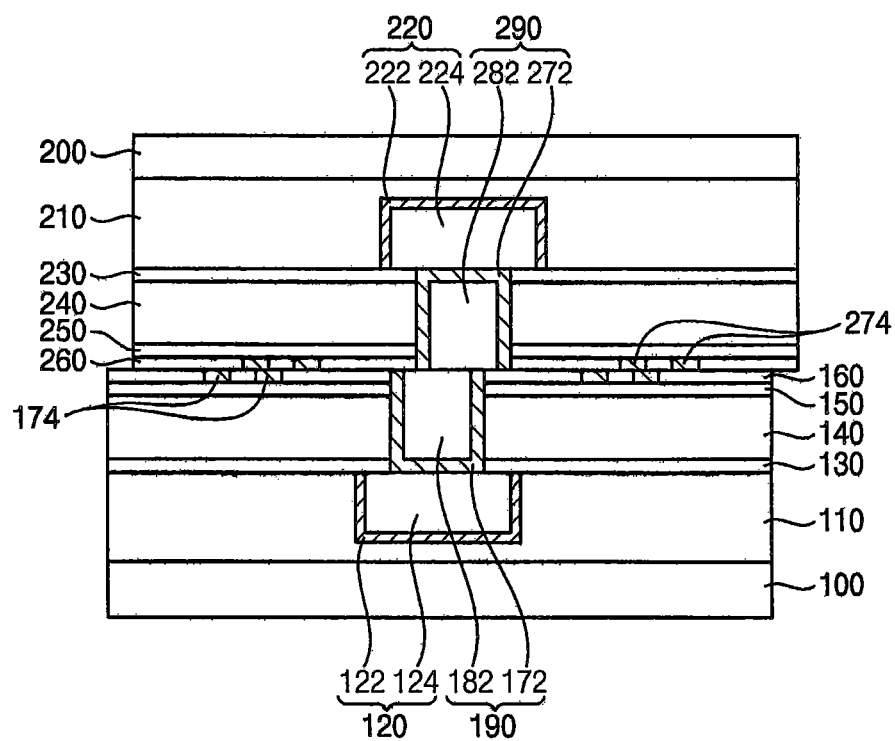
Figure 16:
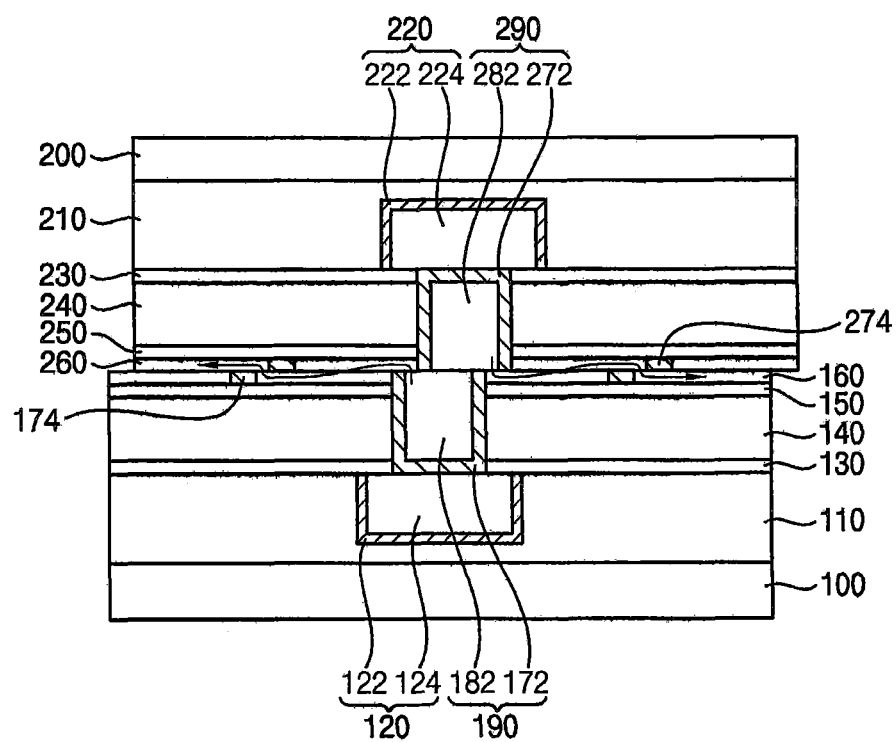

FIG. 15 is a cross-sectional view illustrating a semiconductor device in accordance with some example embodiments, and FIG. 16 is a cross-sectional view illustrating a semiconductor device in accordance with a comparative example (e.g., a comparison with FIGS. 1 and 15). The semiconductor device of FIG. 15 may be substantially the same as or similar to that illustrated with reference to FIG. 1 except for the number of the first and second shield patterns 174 and 274. Thus, like reference numerals refer to like elements, and detailed descriptions thereon may be omitted below in the interest of brevity.

Referring to FIG. 15, a plurality of first shield patterns 174 may be formed in the first bonding insulating layer 160 to be spaced apart from each other, and a plurality of second shield patterns 274 may be formed in the second bonding insulating layer 260 to be spaced apart from each other.

In some example embodiments, at least one of the first shield patterns 174 and at least one of the second shield patterns 274 may contact each other. Moreover, in some embodiments, features of FIGS. 10 and 15 may be combined. For example, the first shield pattern 174 in both the first diffusion blocking insulation layer 150 and the first bonding insulating layer 160, and the second shield pattern 274 in both the second diffusion blocking insulation layer 250 and the second bonding insulating layer 260, as illustrated in FIG. 10, may be combined with FIG. 15 to provide a plurality of the first shield patterns 174 in both the first diffusion blocking insulation layer 150 and the first bonding insulating layer 160, and a plurality of the second shield patterns 274 in both the second diffusion blocking insulation layer 250 and the second bonding insulating layer 260.

As illustrated in FIG. 16, when the first substrate 100 having the first conductive pattern structure 190 and the second substrate 200 having the second conductive pattern structure 290 are bonded with each other, the first and second shield patterns 174 and 274 may not contact each other because of the misalignment between the first and second conductive pattern structures 190 and 290. In this case, the metal of the first and second conductive pattern structures 190 and 290 may diffuse into neighboring conductive pattern structures through the first and second bonding insulating layers 160 and 260. To reduce/prevent the diffusion, as illustrated in FIG. 15, the plurality of first and second shield patterns 174 and 274 may be formed, and at least one of the first shield patterns 174 and at least one of the second shield patterns 274 may contact each other. Accordingly, the diffusion of the metal may be certainly reduced/prevented.

Although FIG. 15 shows respective pairs of first and second shield patterns 174 and 274, a larger number of first and second shield patterns 174 and 274 may be also formed, if desired/needed.

Figure 17:
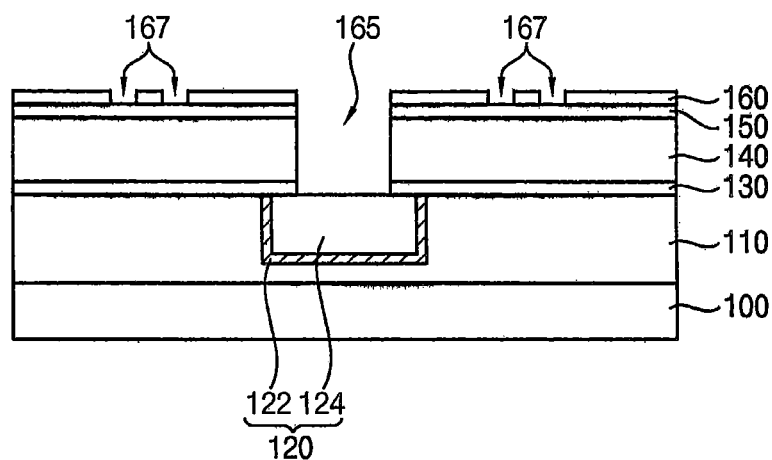
Figure 18:
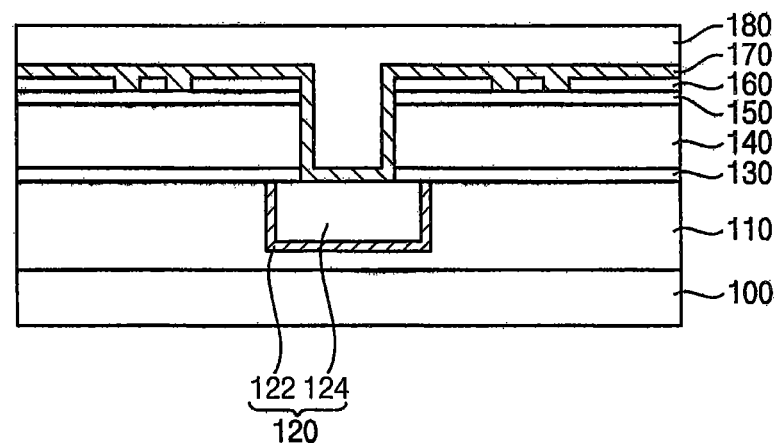
Figure 19:
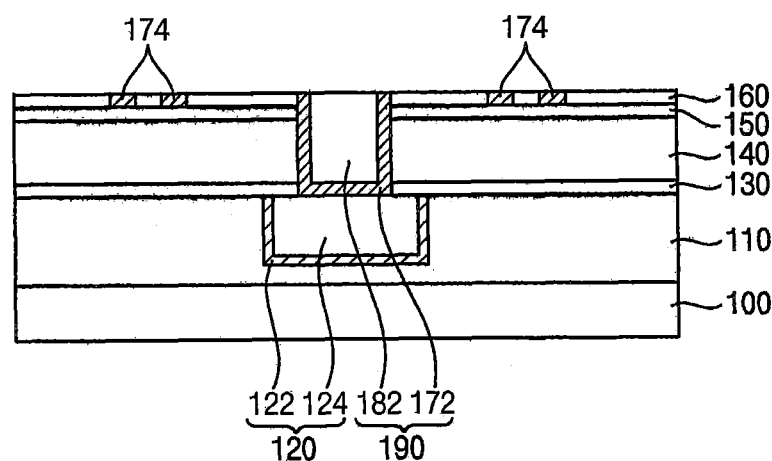
Figure 20:
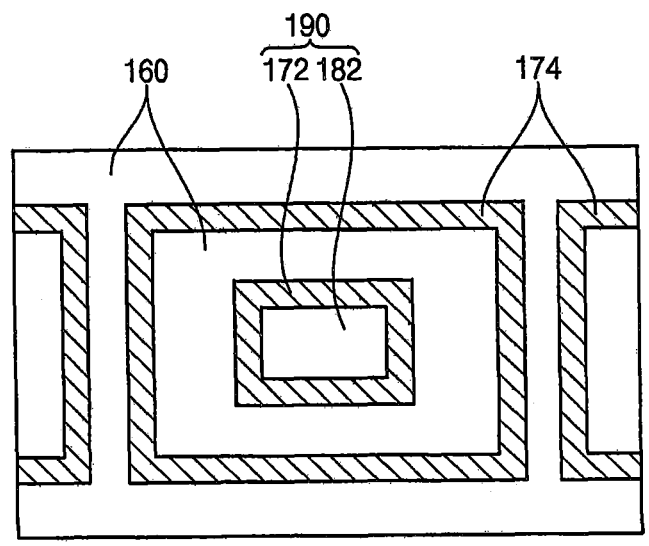

FIGS. 17 to 19 and FIG. 21 are cross-sectional views illustrating stages of a method of manufacturing a semiconductor device in FIG. 15, and FIG. 20 is a plan view illustrating the semiconductor device in FIG. 19. This method may be substantially the same as or similar to that illustrated with reference to FIGS. 3 to 9 except for the number of the first and second shield patterns 174 and 274. Thus, like reference numerals refer to like elements, and detailed descriptions thereon may be omitted below in the interest of brevity.

First, processes substantially the same as or similar to those illustrated with reference to FIG. 3 may be performed.

Referring to FIG. 17, a first opening 165 may be formed through the first bonding insulating layer 160, the first diffusion blocking insulation layer 150, the first insulating interlayer 140, and the first etch stop layer 130, and the second opening 167 may be formed through the first bonding insulating layer 160 and surrounding the first opening 165. In particular, in some example embodiments, a plurality of second openings 167 may be formed through the first bonding insulating layer 160 to be spaced apart from each other.

Referring to FIG. 18, a first barrier layer 170 may be formed on a sidewall and a bottom of the first opening 165 and the first bonding insulating layer 160 to sufficiently fill the second opening 167, and a first conductive layer 180 may be formed on the first barrier layer 170 to sufficiently fill a remaining portion of the first opening 165.

Referring to FIG. 19, the first conductive layer 180 and the first barrier layer 170 may be planarized until a top surface of the first insulating interlayer 160 may be exposed to form a first conductive pattern structure 190 and a first shield pattern 174. The first conductive pattern structure 190 may include a first conductive pattern 182 and the first barrier layer pattern 172, and the first shield pattern 174 may surround the first conductive pattern structure 190.

Referring to FIG. 20, a plurality of first shield patterns 174 spaced apart from each other may be formed to surround the first conductive pattern structure 190. Thus, the first shield patterns 174 may certainly reduce/prevent the diffusion of metal between the first conductive pattern structure 190 and conductive pattern structures adjacent to the first conductive pattern structure 190. FIG. 20 shows a pair of first shield patterns 174 spaced apart from each other at a constant distance, however, a larger number of first shield patterns 174 may be formed, and the interval between the first shield patterns 174 may not be constant.

Figure 21:
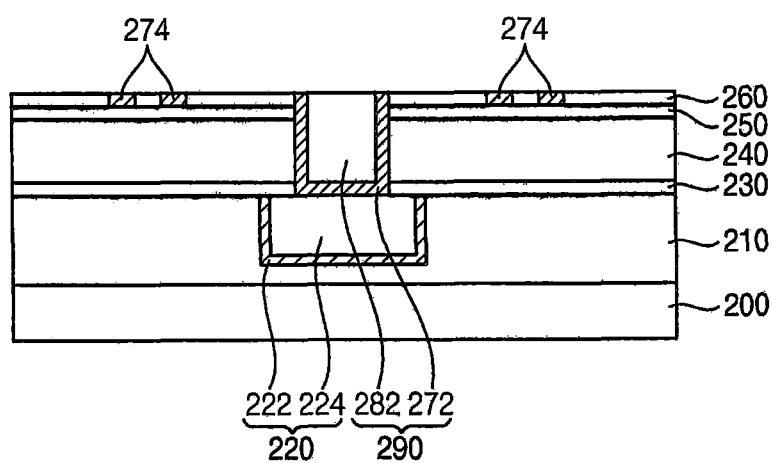

Referring to FIG. 21, processes substantially the same as or similar to those illustrated with reference to FIGS. 3 and 17 to 20 may be performed, so that fourth and second insulating interlayers 210 and 24Q may be sequentially stacked on the second substrate 200, and fourth and second conductive pattern structures 220 and 290 may be formed. The fourth and second conductive pattern structures 220 and 290 may be contained in the fourth and second insulating interlayers 210 and 240, respectively. A second diffusion blocking insulation layer 250 and a second bonding insulating layer 26Q may be sequentially formed on the second insulating interlayer 240 to cover an upper portion of a sidewall of the second conductive pattern structure 290. A plurality of second shield patterns 274 spaced apart from each other may be formed to surround the second conductive pattern structure 29Q. In some example embodiments, a second etch stop layer 230 may be further formed between the second insulating interlayer 240 and the fourth insulating interlayer 210.

Similar to that illustrated with reference to FIG. 9, a plasma treatment may be performed on at least one of the first and second substrates 100 and 200 having the first and second conductive pattern structures 190 and 290 thereon, respectively.

Referring again to FIG. 15, the first and second substrates 100 and 200 may be bonded with each other so that the first and second conductive pattern structures 190 and 290 may contact each other. Thus, the semiconductor device may be completed.

Figure 22:
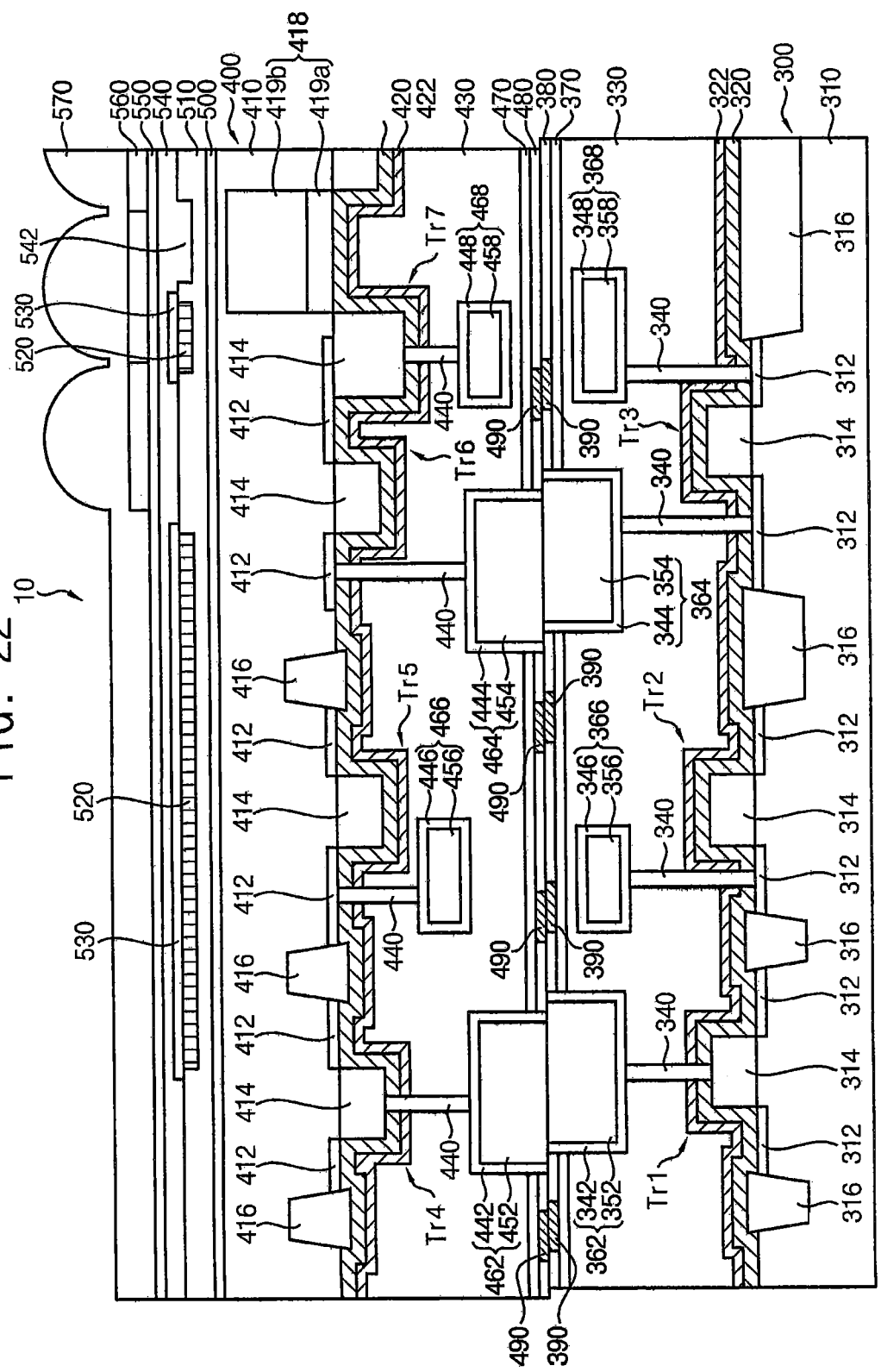

FIG. 22 is a cross-sectional view illustrating a semiconductor device in accordance with some example embodiments. For example, the semiconductor device may be a solid state image sensor.

Referring to FIG. 22, a semiconductor device 10 may include first to third transistors Tr1, Tr2, and Tr3 on a first substrate 300, a first insulating interlayer 330 on the first substrate 300 and the first to third transistors Tr1, Tr2, and Tr3, a first conductive pattern structure 362, which may be partially contained by the first insulating interlayer 330 and protrude upwardly beyond a top surface of the first insulating interlayer 330, a first diffusion blocking insulation layer 370 on the first insulating interlayer 330, which may be on an upper sidewall of the protruding first conductive pattern structure 362, a first bonding insulating layer 380 on the first diffusion blocking insulation layer 370, which may be on the upper sidewall of the protruding first conductive pattern structure 362, a first shield pattern 390 through the first bonding insulating layer 380, which may be spaced apart from the first conductive pattern structure 362 and surround the first conductive pattern structure 362, a second bonding insulating layer 480 on the first bonding insulating layer 380 and the first shield pattern 390, a second diffusion blocking insulation layer 470 on the second bonding insulating layer 480, a second insulating interlayer 430 on the second diffusion blocking insulation layer 470, a third conductive pattern structure 462, which may be formed through the second insulating interlayer 430, the second diffusion blocking insulation layer 470 and the second bonding insulating layer 480 and contact a top surface of the first conductive pattern structure 362, a second shield pattern 490 through the second bonding insulating layer 480, which may be spaced apart from the third conductive pattern structure 462 and surround the third conductive pattern structure 462, fourth to seventh transistors Tr4, Tr5, Tr6, and Tr7 on the second insulating interlayer 430, at least one photodiode 418 on the fourth to seventh transistors Tr4, Tr5, Tr6, and Tr7, and at least one color filter 560 and at least one lens 570 on the photodiode 418, each of which may correspond to (e.g., be a part of) the photodiode 418.

In some example embodiments, the semiconductor device 10 may further include first and second insulating films 320 and 322 sequentially stacked on the first to third transistors Tr1, Tr2, and Tr1 of the first substrate 300. The semiconductor device 10 may further include fourth and third insulating films 422 and 420 sequentially stacked between the second insulating interlayer 430 and the fourth to seventh transistors Tr4, Tr5, Tr6, and Tr7. Each of the first and third insulating films 320 and 420 may include an oxide, e.g., silicon oxide, and each of the second and fourth insulating films 322 and 422 may include a nitride, e.g., silicon nitride. Each of the second and fourth insulating films 322 and 422 may serve as an etch stop layer.

In some example embodiments, the semiconductor device may further include fifth and sixth conductive pattern structures 366 and 368 contained in the first insulating interlayer 330, and seventh and eighth conductive pattern structures 466 and 468 contained in the second insulating interlayer 430. The fifth conductive pattern structure 366 may include a fifth conductive pattern 356 and a fifth barrier layer pattern 346, the sixth conductive pattern structure 368 may include a sixth conductive pattern 358 and a sixth barrier layer pattern 348, the seventh conductive pattern structure 466 may include a seventh conductive pattern 456 and a seventh barrier layer pattern 446, and the eighth conductive pattern structure 468 may include an eighth conductive pattern 458 and an eighth barrier layer pattern 448. The fifth barrier layer pattern 346 may cover the fifth conductive pattern 356, the sixth barrier layer pattern 348 may cover the sixth conductive pattern 358, the seventh barrier layer pattern 446 may cover the seventh conductive pattern 456, and the eighth barrier layer pattern 448 may cover the eighth conductive pattern 458.

In some example embodiments, the semiconductor device 10 may further include a second conductive pattern structure 364 and a fourth conductive pattern structure 464. The second conductive pattern structure 364 may be partially contained by the first insulating interlayer 330 and protrude upwardly beyond a top surface of the first insulating interlayer 330. The fourth conductive pattern structure 464 may be partially contained by the second insulating interlayer 430 and protrude downwardly beyond a bottom surface of the second insulating interlayer 430.

For example, the first conductive pattern structure 362 may include a first conductive pattern 352 and a first barrier layer pattern 342, the second conductive pattern structure 364 may include a second conductive pattern 354 and a second barrier layer pattern 344, the third conductive pattern structure 462 may include a third conductive pattern 452 and a third barrier layer pattern 442, and the fourth conductive pattern structure 464 may include a fourth conductive pattern 454 and a fourth barrier layer pattern 444. The first barrier layer pattern 342 may cover the first conductive pattern 352, the second barrier layer pattern 344 may cover the second conductive pattern 354, the third barrier layer pattern 442 may cover the third conductive pattern 452, and the fourth barrier layer pattern 444 may cover the fourth conductive pattern 454.

In some example embodiments, the semiconductor device may be formed by bonding so that the first conductive pattern structure 362 and the third conductive pattern structure 462 may be well aligned with each other and the second conductive pattern structure 364 and the fourth conductive pattern structure 464 may be well aligned with each other. Alternatively, the first conductive pattern structure 362 and the third conductive pattern structure 462 may be bonded to be misaligned, and the second conductive pattern structure 364 and the fourth conductive pattern structure 464 may be bonded to be misaligned, which is illustrated in FIG. 22. In this case, the first bonding insulating layer 380 may contact the third and fourth conductive pattern structures 462 and 464, and the second bonding insulating layer 480 may contact the first and second conductive pattern structures 362 and 364.

In the semiconductor device 10 in accordance with some example embodiments, the diffusion of the metal of the conductive pattern structures 362, 364, 462, and 464 may be reduced/prevented, even though the first and second conductive pattern structures 362 and 364 and the third and fourth conductive pattern structures 462 and 464 may not be well aligned with each other, respectively. Particularly, the first diffusion blocking insulation layer 370 may reduce/prevent the diffusion of the metal into the first insulating interlayer 330, and the second diffusion blocking insulation layer 470 may reduce/prevent the diffusion of the metal into the second insulating interlayer 430. The first and second shield patterns 390 and 490 may reduce/prevent the diffusion of the metal into neighboring conductive pattern structures through the first and second bonding insulating layers 380 and 480. Accordingly, electrical characteristics of the semiconductor device may not be deteriorated.

In some example embodiments, the semiconductor device 10 may further include a first contact plug 340 in the first insulating interlayer 330 and a second contact plug 440 in the second insulating interlayer 430.

In some example embodiments, a plurality of first contact plugs 340 may be formed, and end portions of the first contact plugs 340 may contact the first conduct pattern structure 362, the second conduct pattern structure 364, the fifth conduct pattern structure 366, and the sixth conduct pattern structure 368, respectively. Other end portions of the first contact plugs 340 may contact a plurality of first source/drain regions 312, respectively. In some example embodiments, a plurality of second contact plugs 440 may be formed, and end portions of the second contact plugs 440 may contact the third conduct pattern structure 462, the fourth conduct pattern structure 464, the seventh conduct pattern structure 466, and the eighth conduct pattern structure 468, respectively. Other end portions of the second contact plugs 440 may contact a plurality of second source/drain regions 412, respectively.

The semiconductor device 10 may further include a second substrate 400 on the fourth to seventh transistors Tr4, Tr5, Tr6, and Tr7, if desired/needed. The second substrate 400 may include a material substantially the same as that of the first substrate 300.

The second substrate 400 may include a photodiode 418 therein. The photodiode 418 may include a first semiconductor region 419a and a second semiconductor region 419b.

The semiconductor device 10 in accordance with some example embodiments may further include a waveguide 542 overlying the photodiode 418, a color filter 560 on the waveguide 542, and a lens 570 on the color filter 560. For example, the color filter 560 may include an organic layer containing red, green, or blue pigment. A light incident onto the lens 570 may sequentially pass through the color filter 560 and the waveguide 542 to be concentrated onto the photodiode 418, and may be converted into an electrical energy.

The semiconductor device 10 in accordance with some example embodiments may further include an anti-reflective layer 500 on the second substrate 400, a third insulating interlayer 510 on the anti-reflective layer 500, a shielding layer pattern 520 contained by the third insulating interlayer 510, and a capping layer pattern 530 on the shielding layer pattern 520 and the third insulating interlayer 510, which capping layer pattern 530 may sufficiently/completely cover/overlap the shielding layer pattern 520.

FIGS. 23 to 33 are cross-sectional views illustrating stages of a method of manufacturing the semiconductor device in FIG. 22.

Figure 23:
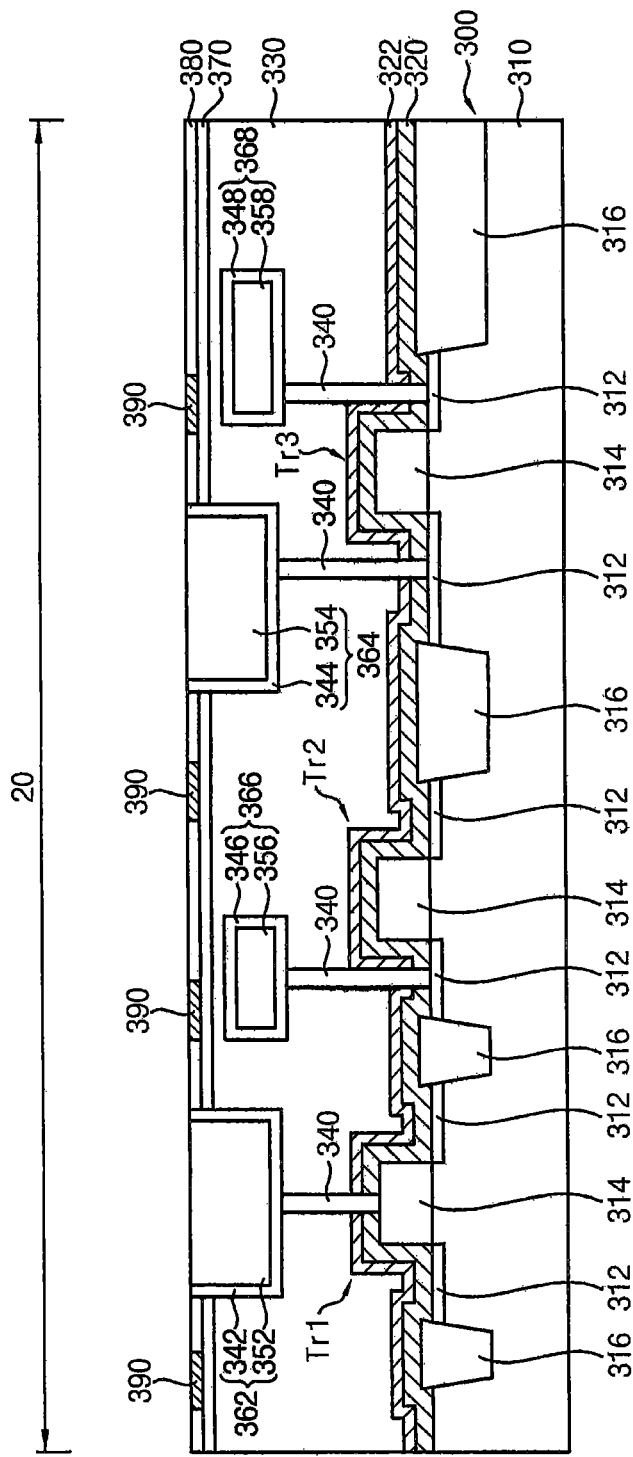

Referring to FIG. 23, a first gate structure 314 may be formed on a first substrate 300 having a first isolation layer 316 thereon.

A first well region 310 may be formed in the first substrate 300. For example, the first well region 310 may be formed by implanting p-type impurities into the first substrate 300.

A first source/drain region 312 may be formed at an upper portion of the first substrate 300 adjacent to the first gate structure 314. For example, the first source/drain region 312 may be formed by implanting n-type impurities into the first substrate 300.

Accordingly, the first gate structure 314 and the first source/drain region 312 may define a transistor. In some example embodiments, a plurality of transistors, for example, first to third transistors Tr1, Tr2, and Tr3 may be formed on the first substrate 300. The first to third transistors Tr1, Tr2, and Tr3 may be formed in a logic area 20.

First and second insulating films 320 and 322 may be sequentially formed on the first substrate 300 to cover the first to third transistors Tr1, Tr2, and Tr3. The first insulating film 320 may be formed of, e.g., silicon oxide, and the second insulating film 322 may be formed of, e.g., silicon nitride.

A first insulating interlayer 330 having a first contact plug 340 therein may be formed on the second insulating film 322.

The first contact plug 340 may contact the first source/drain region 312, thereby being electrically connected to the first to third transistors Tr1, Tr2, and Tr3. The first contact plug 340 may be formed of, e.g., doped polysilicon, a metal, and/or a metal nitride, or the like.

Fifth and sixth conductive pattern structures 366 and 368 contacting the first contact plug 340 may be formed in the first insulating interlayer 330. In some example embodiments, the fifth conductive pattern structure 366 may be formed to include a fifth conductive pattern 356 and a fifth barrier layer pattern 346, and the sixth conductive pattern structure 368 may be formed to include a sixth conductive pattern 358 and a sixth barrier layer pattern 348. The fifth barrier layer pattern 346 may cover the fifth conductive pattern 356, and the sixth barrier layer pattern 348 may cover the sixth conductive pattern 358.

Processes substantially the same as or similar to those illustrated with reference to FIGS. 3 to 6 may be performed, so that a first diffusion blocking insulation layer 370 and a first bonding insulating layer 380 may sequentially formed on the first insulating interlayer 330, and a first conductive pattern structure 362, a second conductive pattern structure 364, and a first shield pattern 390 may be formed on the first insulating interlayer 330. The first and second conductive pattern structures 362 and 364 may contact the first contact plug 340, and the first shield pattern 390 may be formed through the first bonding insulating layer 380 to surround the first and second conductive pattern structures 362 and 364. In some example embodiments, the first conductive pattern structure 362 may be formed to include a first conductive pattern 352 and a first barrier layer pattern 342, and the second conductive pattern structure 364 may be formed to include a second conductive pattern 354 and a second barrier layer pattern 344. The first barrier layer pattern 342 may cover the first conductive pattern 352, and the second barrier layer pattern 344 may cover the second conductive pattern 354.

The first conductive pattern structure 362, the second conductive pattern structure 364, and the first shield pattern 390 may be formed by performing a CMP process.

In some embodiments, a plurality of first shield patterns 390 spaced apart from each other may be formed through the first bonding insulating layer 380. Alternatively, the first shield patterns 390 may be formed through both of the first bonding insulating layer 380 and the first diffusion blocking insulation layer 370.

Figure 24:
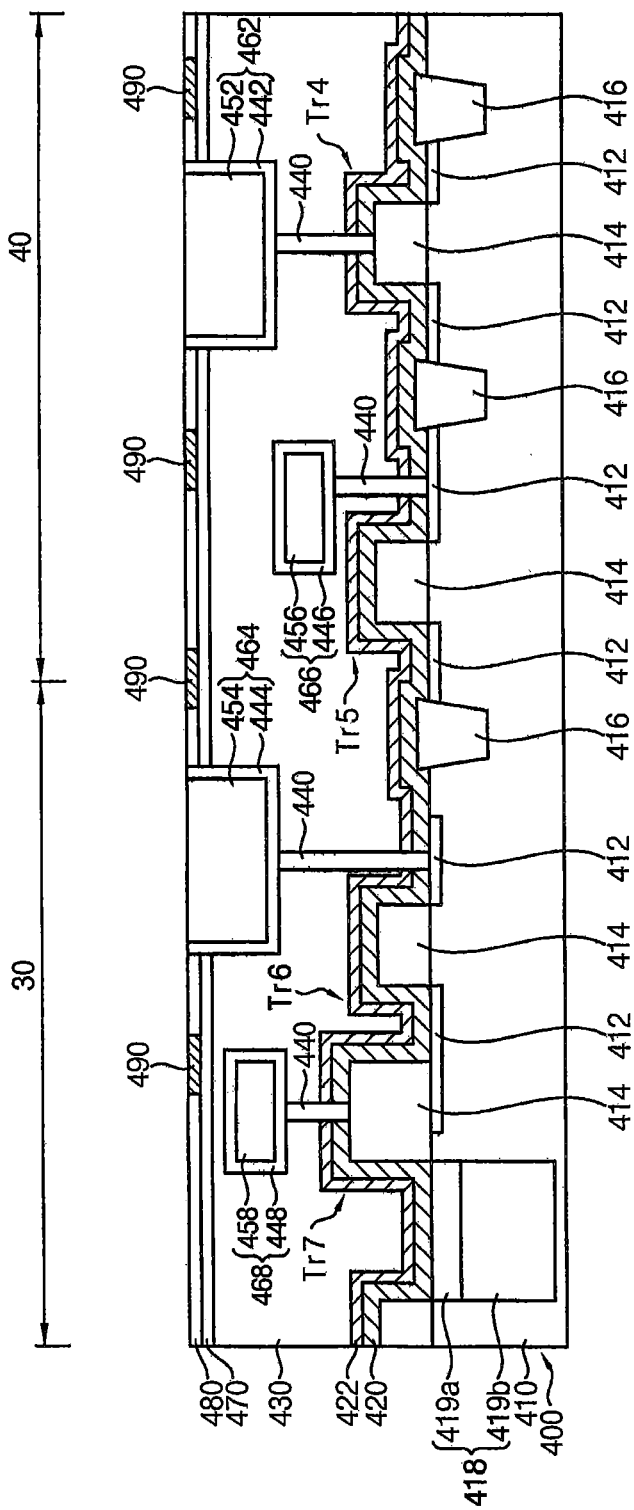

Referring to FIG. 24, a second well region 410 may be formed in the second substrate 400. For example, the second well region 410 may be formed by implanting p-type impurities into the second substrate 400.

In some example embodiments, the photodiode 418 may include a second semiconductor region 419b and a first semiconductor region 419a sequentially stacked. The first semiconductor region 419a may be formed by implanting p-type impurities into the second substrate 400, and the second semiconductor region 419b may be formed by implanting n-type impurities into the second substrate 400.

Processes substantially the same as or similar to those illustrated with reference to FIG. 23 may be performed, so that a second gate structure 414 may be formed on the second substrate 400, and a second source/drain region 412 may be formed on the second substrate 400 adjacent to the second gate structure 414. The second gate structure 414 and the second source/drain region 412 may form a transistor.

In some example embodiments, a plurality of transistors, e.g., fourth to seventh transistors Tr4, Tr5, Tr6, and Tr7 may be formed on the second substrate 400. The fourth and fifth transistors Tr4 and Tr5 may be formed in a control area 40, and the sixth and seventh transistors Tr6 and Tr7 may be formed in a pixel area 30.

Alternatively, the first to third transistors Tr1, Tr2, and Tr3 may be formed in the logic area 20 and the control area 40, and the fourth to seventh transistors Tr4, Tr5, Tr6, and Tr7 may be formed in the pixel area 30.

Third and fourth insulating films 420 and 422 may be sequentially formed on the fourth to seventh transistors Tr4, Tr5, Tr6, and Tr7. The third insulating film 420 may be formed of, e.g., silicon oxide, and the fourth insulating film 422 may be formed of, e.g., silicon nitride.

A second insulating interlayer 430 having a second contact plug 440 therein may be formed on the fourth insulating film 422.

The second contact plug 440 may contact the second source/drain region 412, thereby being electrically connected to the fourth to seventh transistors Tr4, Tr5, Tr6, and Tr7. The second contact plug 440 may be formed of, e.g., doped polysilicon, a metal, and/or a metal nitride, or the like.

Seventh and eighth conductive pattern structures 466 and 468 contacting the second contact plug 440 may be formed in the second insulating interlayer 430. In some example embodiments, the seventh conductive pattern structure 466 may be formed to include a seventh conductive pattern 456 and a seventh barrier layer pattern 446, and the eighth conductive pattern structure 468 may be formed to include an eighth conductive pattern 458 and an eighth barrier layer pattern 448. The seventh barrier layer pattern 446 may cover the seventh conductive pattern 456, and the eighth barrier layer pattern 448 may cover the eighth conductive pattern 458.

Processes substantially the same as or similar to those illustrated with reference to FIGS. 3 to 6 may be performed, so that a second diffusion blocking insulation layer 470 and a second bonding insulating layer 480 may sequentially formed on the second insulating interlayer 430, and a third conductive pattern structure 462, a fourth conductive pattern structure 464 and a second shield pattern 490 may be formed on the second insulating interlayer 430. The third and fourth conductive pattern structures 462 and 464 may contact the second contact plug 440, and the second shield pattern 490 may be formed through the second bonding insulating layer 480 to surround the third and fourth conductive pattern structures 462 and 464. In some example embodiments, the third conductive pattern structure 462 may be formed to include a third conductive pattern 452 and a third barrier layer pattern 442, and the fourth conductive pattern structure 464 may be formed to include a fourth conductive pattern 454 and a fourth barrier layer pattern 444. The third barrier layer pattern 442 may cover the third conductive pattern 452, and the fourth barrier layer pattern 444 may cover the fourth conductive pattern 454.

The third conductive pattern structure 462, the fourth conductive pattern structure 464, and the second shield pattern 490 may be formed by performing a CMP process.

In some embodiments, a plurality of second shield patterns 490 spaced apart from each other may be formed through the second bonding insulating layer 480. Alternatively, the second shield patterns 490 may be formed through both of the second bonding insulating layer 480 and the second diffusion blocking insulation layer 470.

Figure 25:
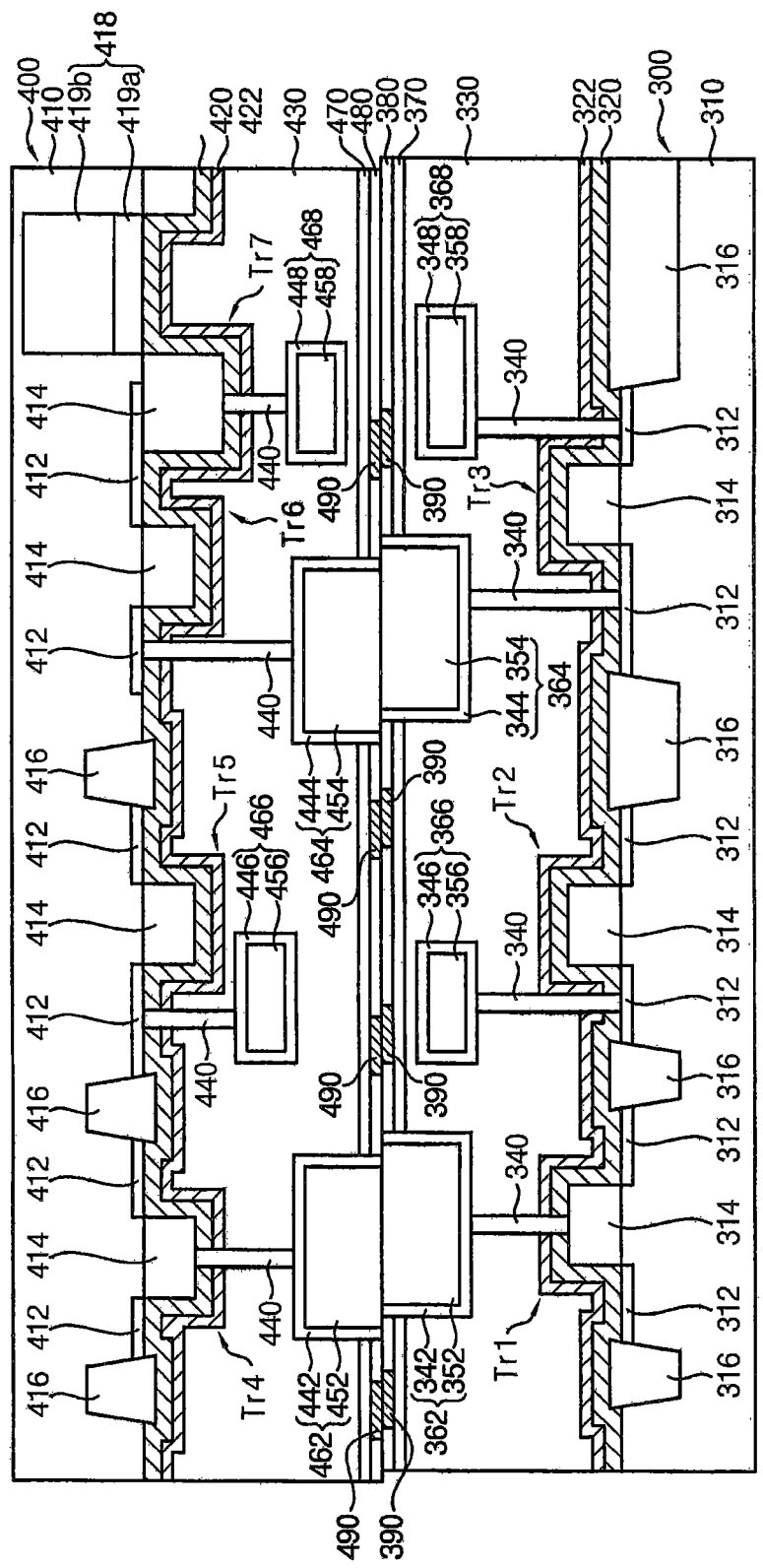

Referring to FIG. 25, the first and second substrates 300 and 400 may be bonded by performing processes substantially the same as or similar to those illustrated with reference to FIGS. 9 and 10.

Figure 26:
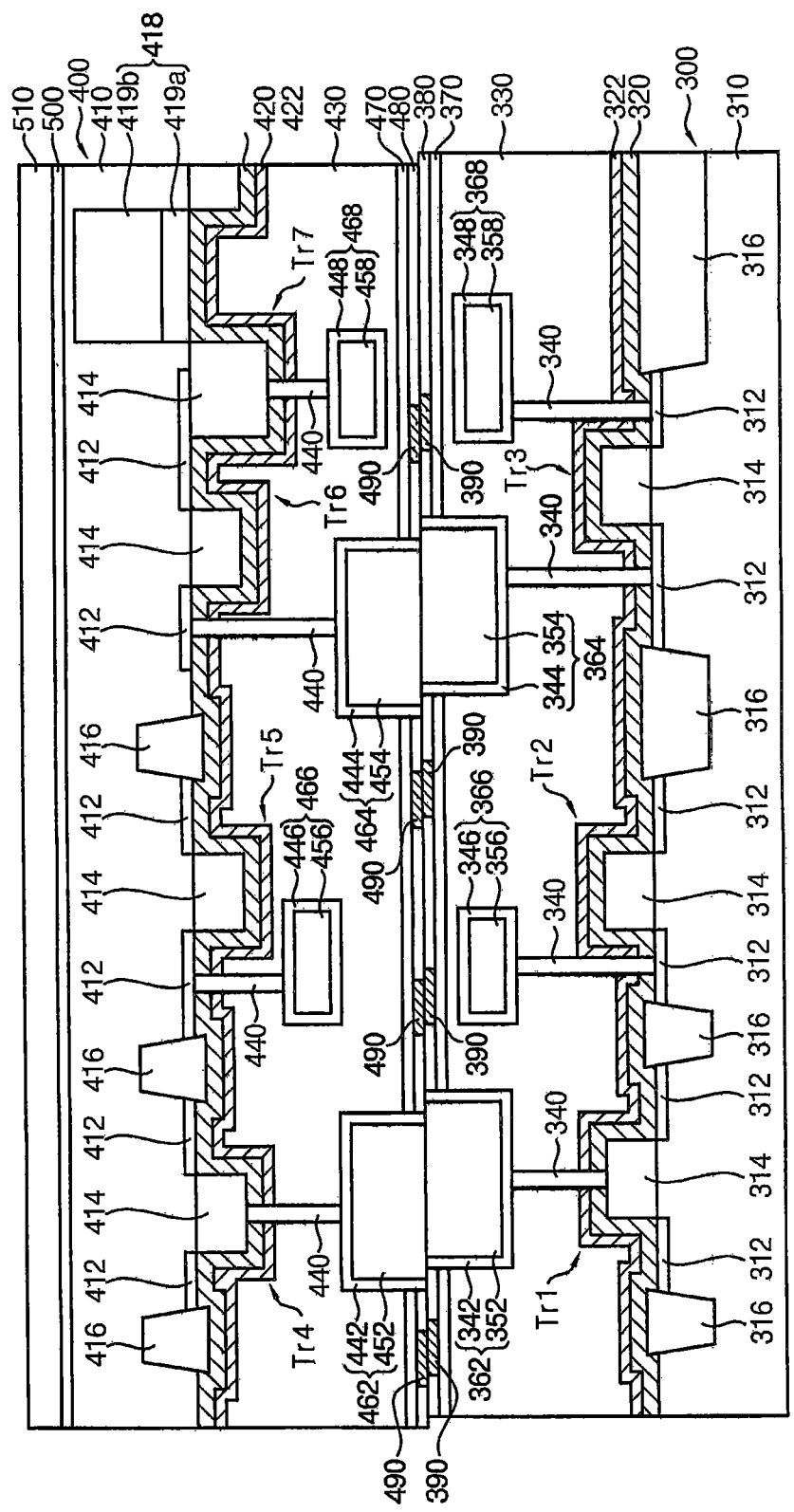

Referring to FIG. 26, an anti-reflective layer 500 and a third insulating interlayer 510 may be sequentially formed on the second substrate 400. The anti-reflective layer 500 may be formed of, e.g., hafnium oxide. In an example embodiment, the third insulating interlayer 510 may be formed of a material substantially the same as that of the first and second insulating interlayers 330 and 430. The third insulating interlayer 510 may be formed of nitride, e.g., silicon nitride, or a low-k dielectric material.

Figure 27:
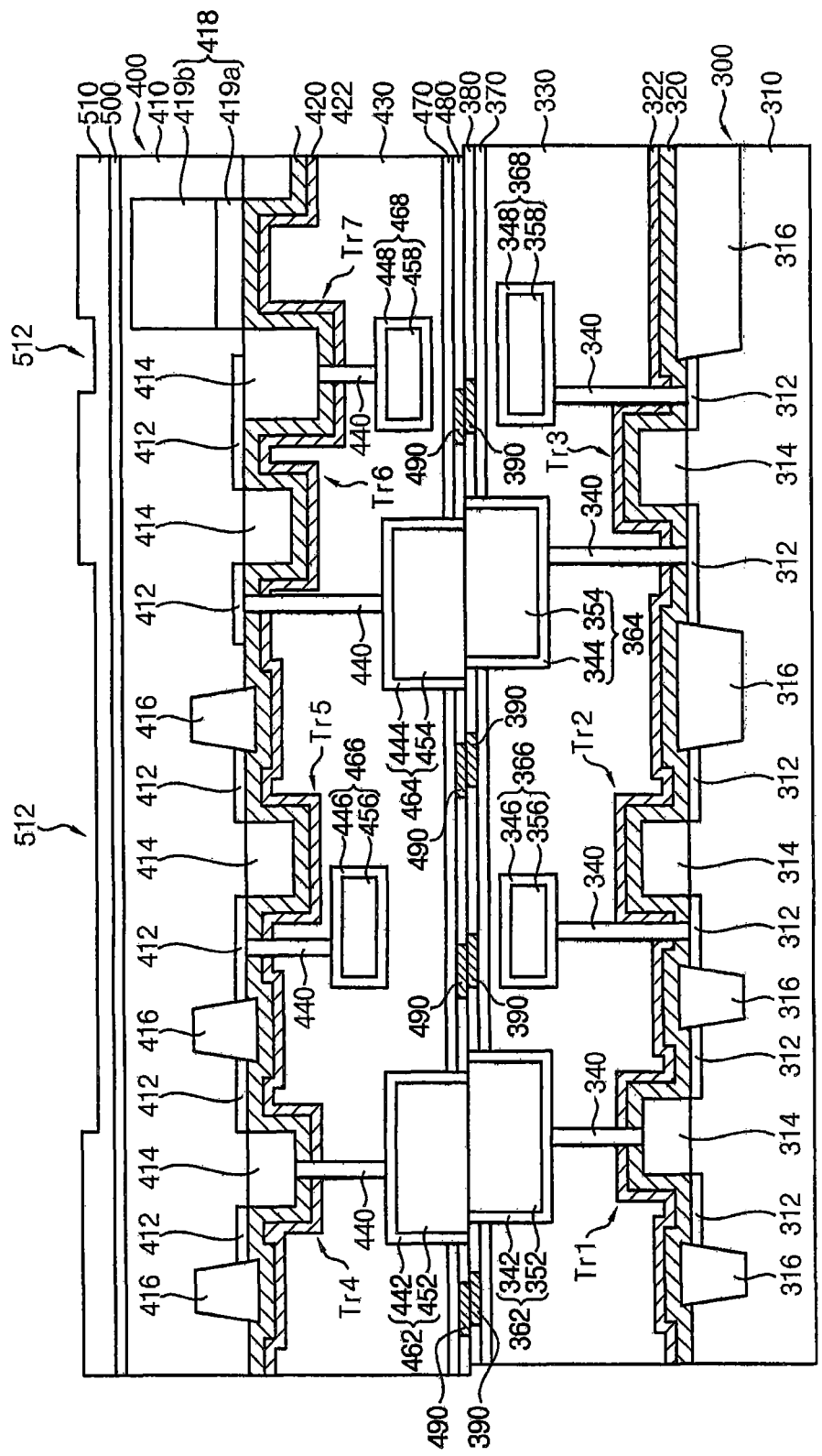

Referring to FIG. 27, a first trench 512 may be formed on the third insulating interlayer 510. In an example embodiment, a plurality of first trenches 512 may be formed.

Figure 28:
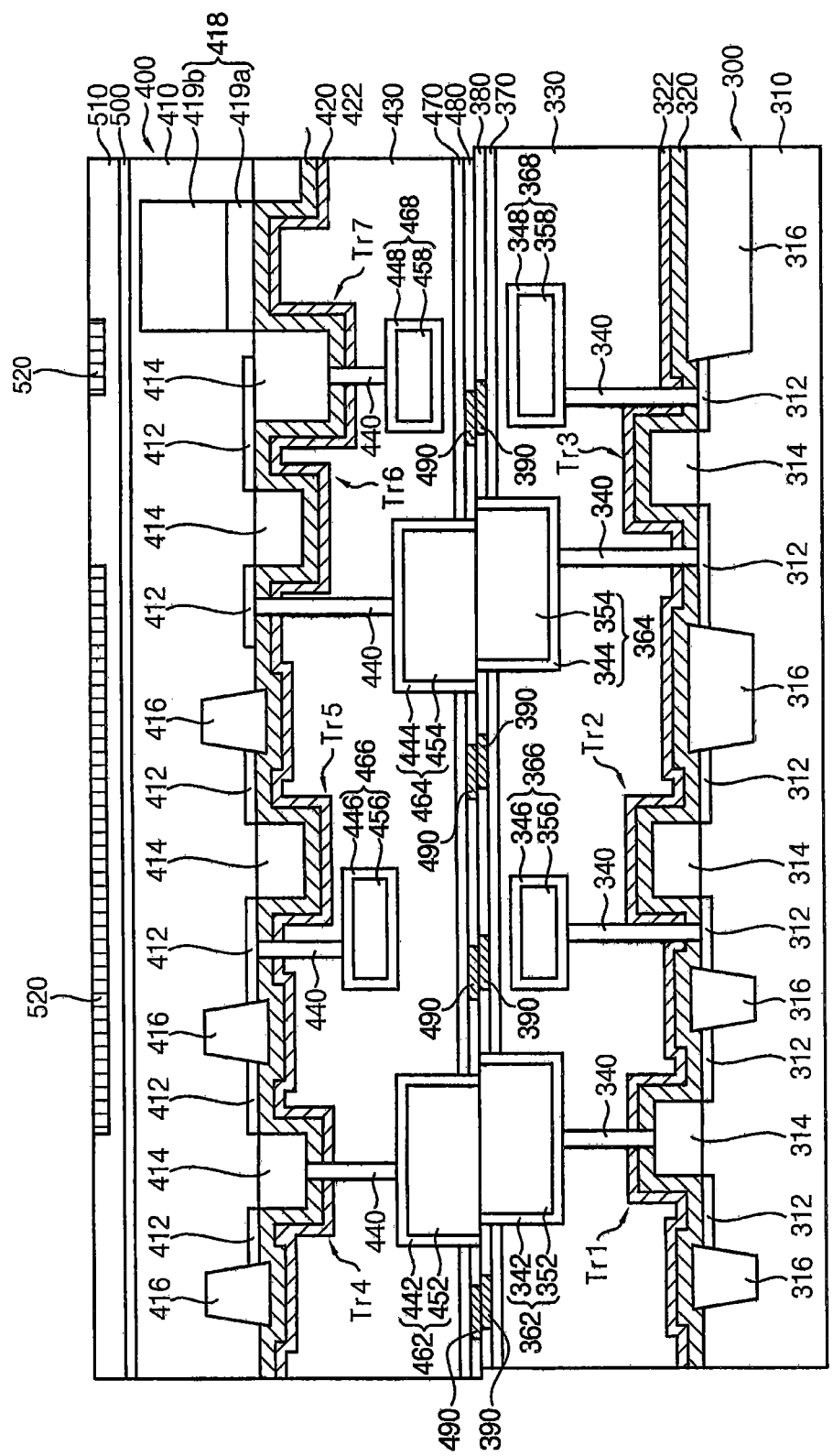

Referring to FIG. 28, a shielding layer may be formed on the third insulating interlayer 510 to sufficiently fill the first trench 512. The shielding layer may be formed of a conductive material, e.g., copper.

The shielding layer may be planarized until a top surface of the third insulating interlayer 510 may be exposed to form a shielding layer pattern 520. For example, the planarization process may include a CMP process.

Figure 29:
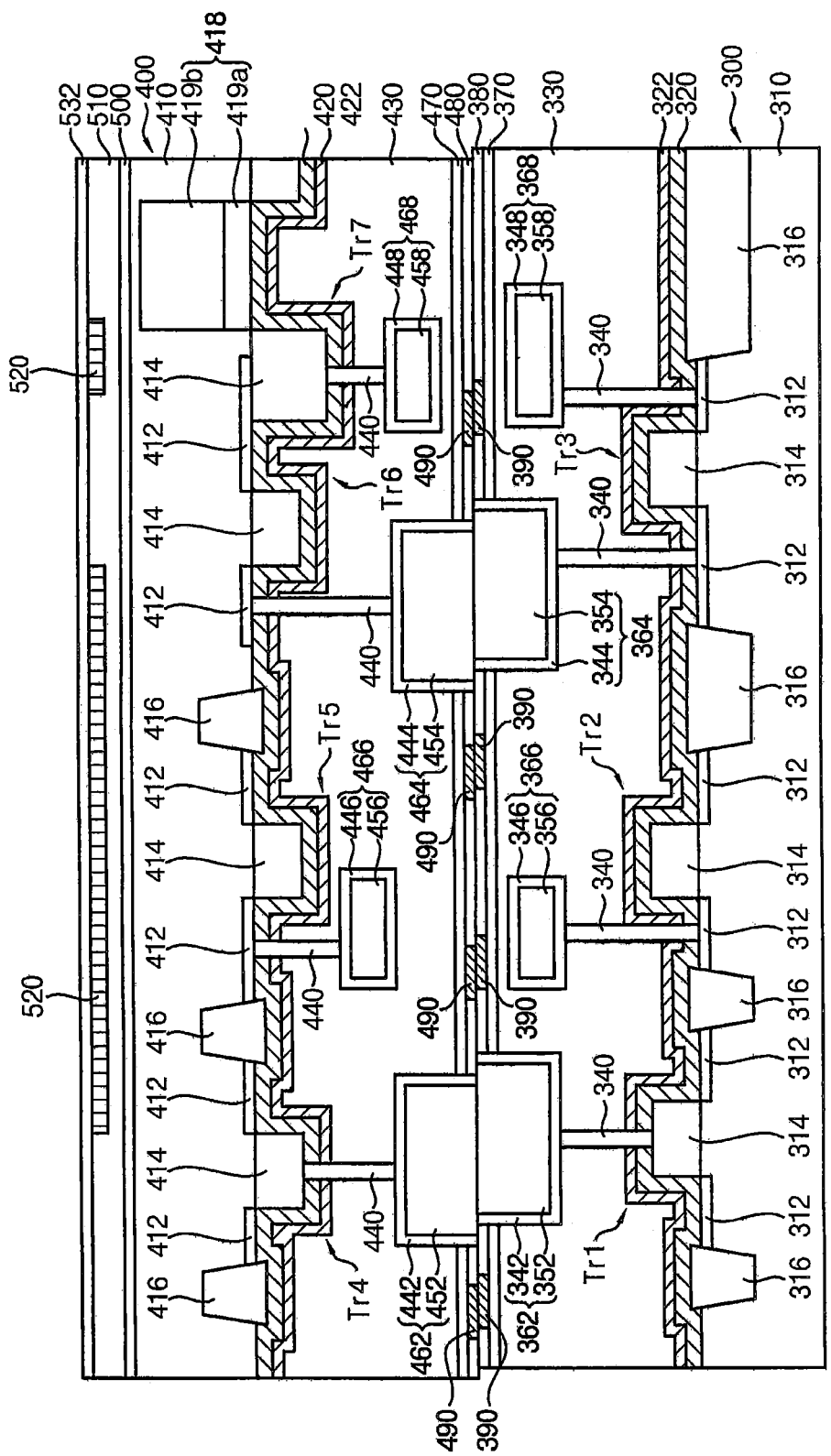

Referring to FIG. 29, a capping layer 532 may be formed on the third insulating interlayer 510 and the shielding layer pattern 520 to include a nitride, e.g., silicon nitride, silicon carbonitride, or the like.

Figure 30:
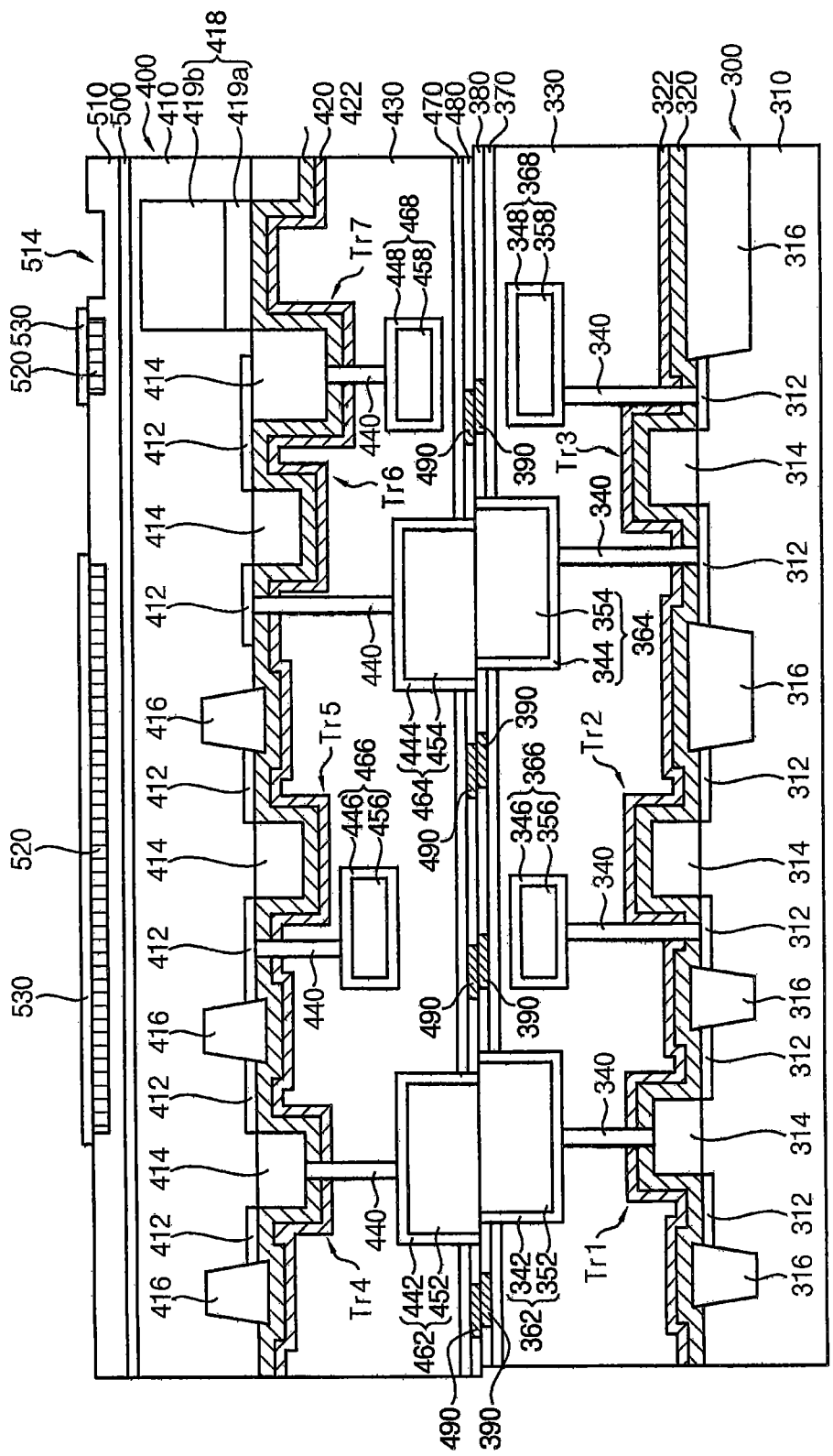

Referring to FIG. 30, a capping layer pattern 530 and a second trench 514 may be formed by partially etching the capping layer 532 and the third insulating interlayer 510, respectively.

In some example embodiments, the capping layer pattern 530 may be formed to sufficiently/completely cover/overlap the shielding layer pattern 520, and the second trench 514 may be formed to overlie the photodiode 418.

Figure 31:
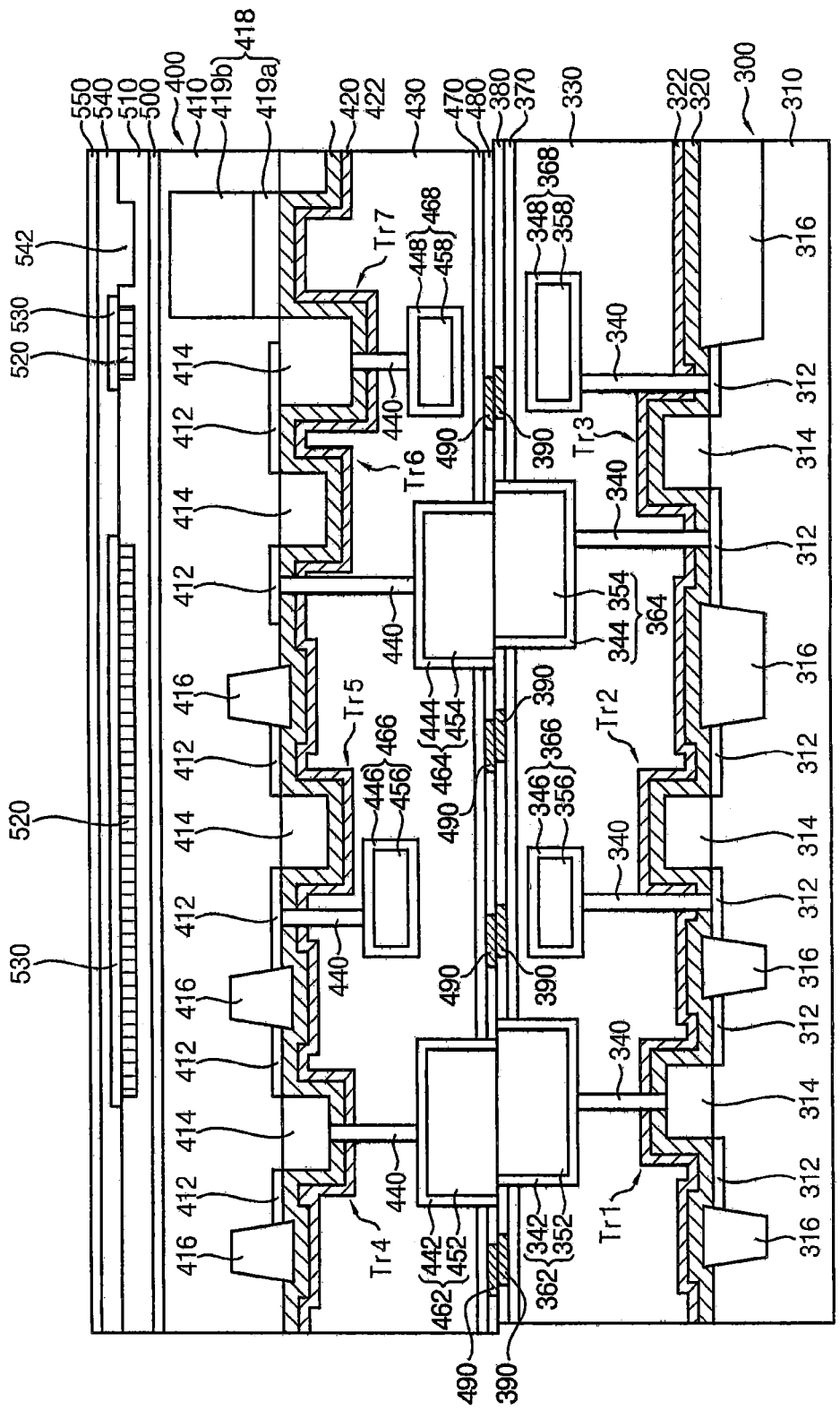

Referring to FIG. 31, a waveguide material layer 540 may be formed on the third insulating interlayer 510 and capping layer pattern 530 to sufficiently fill the second trench 514. The waveguide material layer 540 may include a nitride, e.g., silicon nitride.

A portion of the waveguide material layer 540 filling the second trench 514 may serve as a waveguide 542. The waveguide 542 may efficiently concentrate incident light onto the photodiode 418.

A planarization layer 550 may be formed on the waveguide material layer 540.

Figure 32:
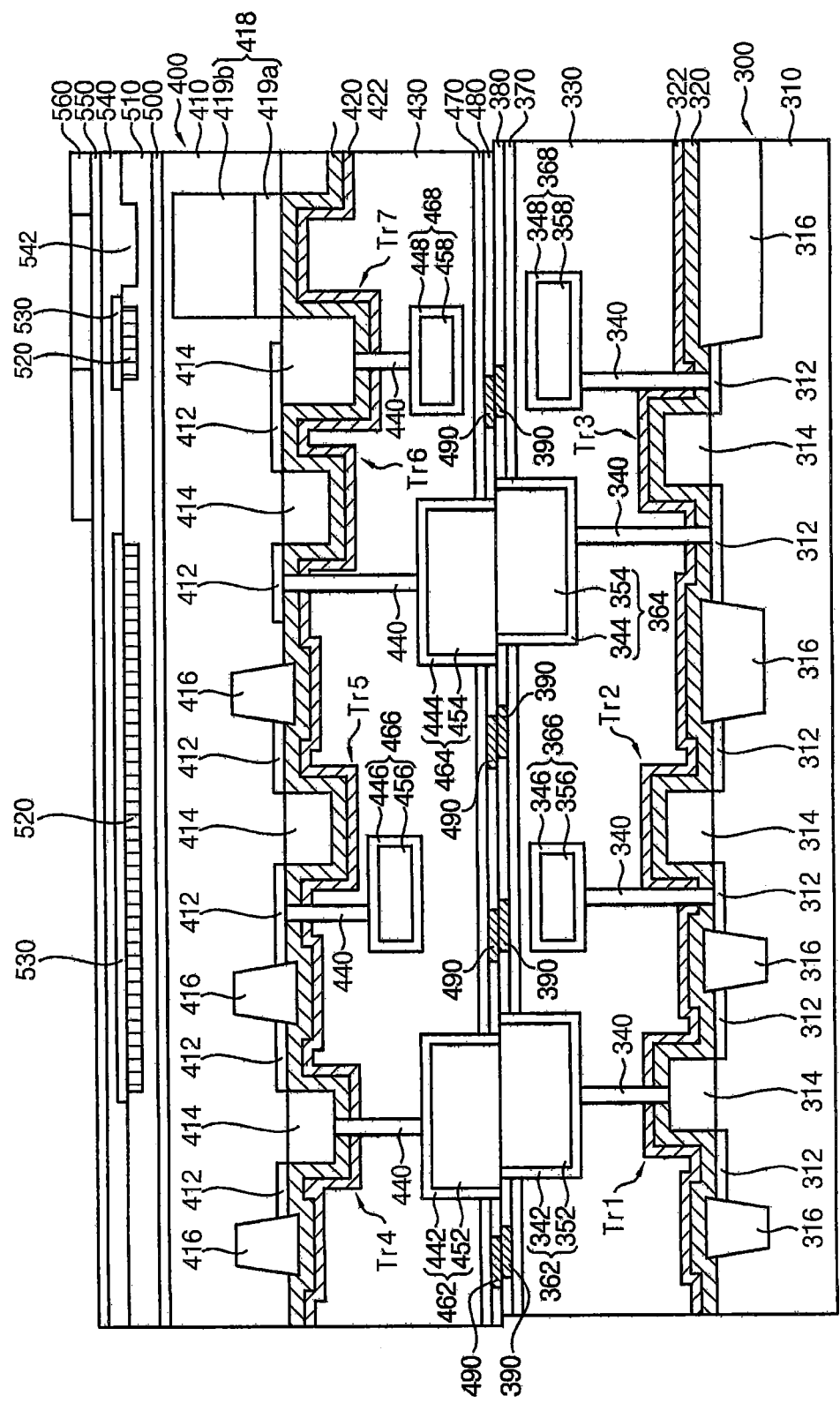

Referring to FIG. 32, a color filter 560 corresponding to each pixel may be formed on the planarization layer 550 overlying the photodiode 418.

A color filter 560 may be formed by forming an organic layer containing red, green, or blue pigment and patterning the organic layer.

Figure 33:
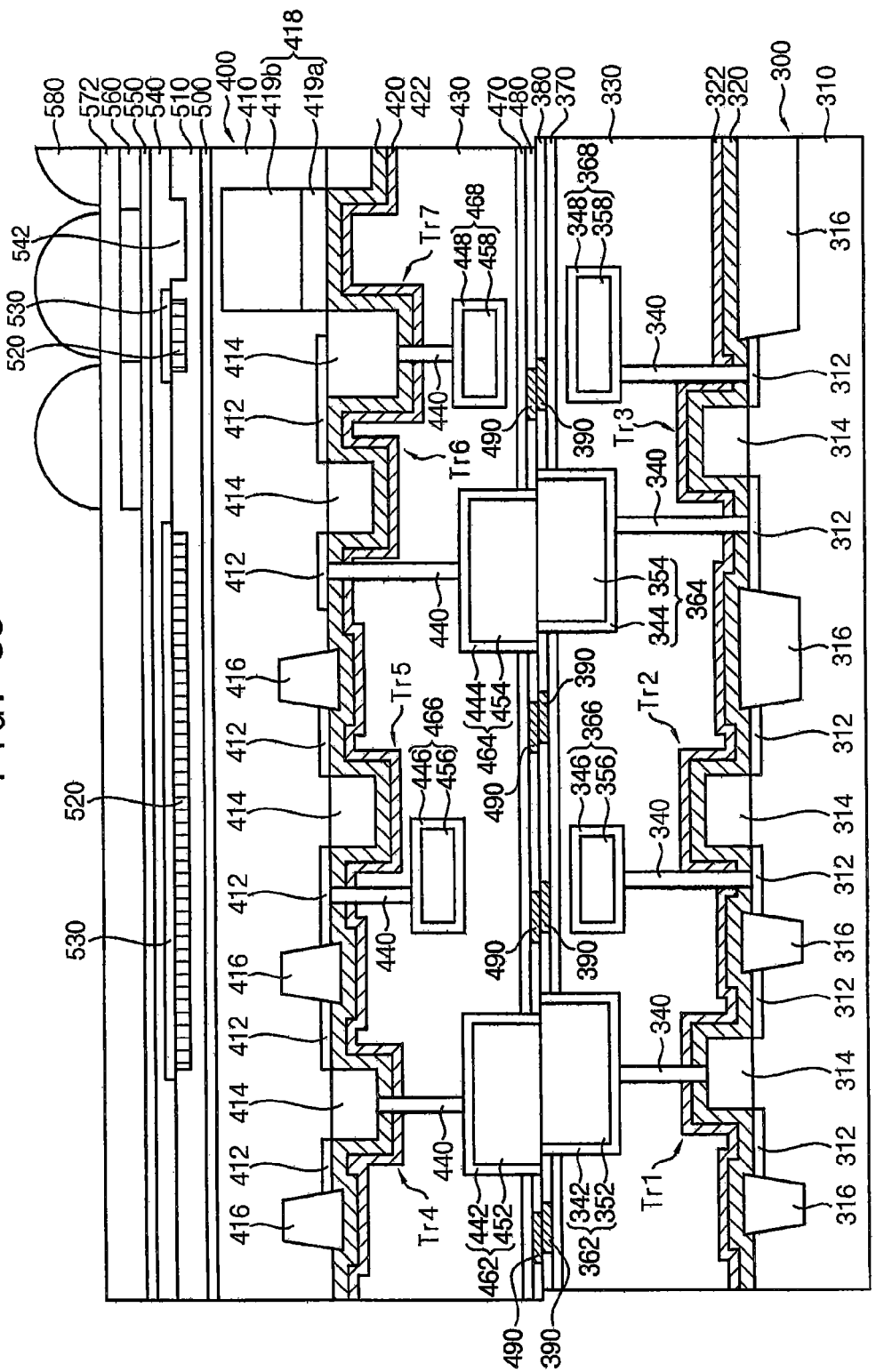

Referring to FIG. 33, a lens material layer 572 may be formed on the planarization layer 550 and the color filter 560. The lens material layer 572 may be formed of an organic material, or an inorganic material, e.g., silicon oxide, silicon nitride, silicon oxynitride, or the like.

A resist film 580 may be formed in a region corresponding to each pixel on the lens material layer 572. As described with respect to FIG. 22, a lens 570 may be formed by etching the lens material layer 572 so that a shape of the resist film 580 may be transferred.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. A semiconductor device, comprising:
a substrate;
a first insulating interlayer on the substrate;
a first conductive pattern structure in the first insulating interlayer, the first conductive pattern structure protruding upwardly beyond a top surface of the first insulating interlayer;
a first diffusion blocking insulation layer on the first insulating interlayer, the first diffusion blocking insulation layer on an upper portion of a sidewall of the first conductive pattern structure that protrudes beyond the first insulating interlayer;
a first bonding layer on the first diffusion blocking insulation layer, the first bonding layer on the upper portion of the sidewall of the first conductive pattern structure that protrudes beyond the first insulating interlayer;
a first shield pattern in the first bonding layer, the first shield pattern being spaced apart from the first conductive pattern structure and surrounding the first conductive pattern structure;
a second bonding layer on the first bonding layer and the first shield pattern;
a second diffusion blocking insulation layer on the second bonding layer;
a second insulating interlayer on the second diffusion blocking insulation layer;
a second conductive pattern structure in the second insulating interlayer, the second diffusion blocking insulation layer, and the second bonding layer, the second conductive pattern structure contacting a top surface of the first conductive pattern structure; and
a second shield pattern in the second bonding layer, the second shield pattern being spaced apart from the second conductive pattern structure and surrounding the second conductive pattern structure.

2. The semiconductor device of claim 1, wherein the first and second shield patterns contact each other.

3. The semiconductor device of claim 1,
wherein the first conductive pattern structure comprises:
a first barrier layer pattern on sidewalls of the first insulating interlayer, the first diffusion blocking insulation layer, and the first bonding layer, respectively; and
a first conductive pattern,
wherein the first barrier layer pattern is on a sidewall and a bottom surface of the first conductive pattern,
wherein the second conductive pattern structure comprises:
a second barrier layer pattern on sidewalls of the second insulating interlayer, the second diffusion blocking insulation layer, and the second bonding layer, respectively; and
a second conductive pattern, and
wherein the second barrier layer pattern is on a sidewall and a top surface of the second conductive pattern.

4. The semiconductor device of claim 3, wherein the first and second barrier layer patterns and the first and second shield patterns each comprise a metal, a metal nitride, or a metal alloy.

5. The semiconductor device of claim 3, wherein each of the first and second conductive patterns comprises copper, aluminum, tungsten, and/or nickel.

6. The semiconductor device of claim 1, further comprising:
a third insulating interlayer between the substrate and the first insulating interlayer, the third insulating interlayer comprising a third conductive pattern structure therein that contacts the first conductive pattern structure; and
a fourth insulating interlayer on the second insulating interlayer, the fourth insulating interlayer comprising a fourth conductive pattern structure therein that contacts the second conductive pattern structure.

7. The semiconductor device of claim 6, further comprising:
a first etch stop layer between the first and third insulating interlayers, the first etch stop layer on a lower portion of the sidewall of the first conductive pattern structure; and
a second etch stop layer between the second and fourth insulating interlayers, the second etch stop layer on an upper portion of a sidewall of the second conductive pattern structure.

8. The semiconductor device of claim 1, wherein the first conductive pattern structure contacts the second bonding layer, and the second conductive pattern structure contacts the first bonding layer.

9. The semiconductor device of claim 1, wherein the first shield pattern comprises a plurality of first shield patterns spaced apart from each other in the first bonding layer, and the second shield pattern comprises a plurality of second shield patterns spaced apart from each other in the second bonding layer.

10. The semiconductor device of claim 9, wherein at least one of the plurality of first shield patterns and at least one of the plurality of second shield patterns contact each other.

11. A semiconductor device, comprising:
a substrate;
a first insulating interlayer on the substrate;
a first conductive connector in the first insulating interlayer, the first conductive connector protruding upwardly beyond a top surface of the first insulating interlayer;
a first diffusion blocking layer on the first insulating interlayer, the first diffusion blocking layer on an upper portion of a sidewall of the first conductive connector that protrudes beyond the first insulating interlayer;
a first bonding layer on the first diffusion blocking layer, the first bonding layer on the upper portion of the sidewall of the first conductive connector that protrudes beyond the first insulating interlayer;
a first shield pattern in the first bonding layer and the first diffusion blocking layer, the first shield pattern being spaced apart from and defining a perimeter around the first conductive connector;
a second bonding layer on the first bonding layer and the first shield pattern;
a second diffusion blocking layer on the second bonding layer;
a second insulating interlayer on the second diffusion blocking layer;
a second conductive connector in the second insulating interlayer, the second diffusion blocking layer, and the second bonding layer, the second conductive connector contacting a top surface of the first conductive connector; and
a second shield pattern in the second bonding layer and the second diffusion blocking layer, the second shield pattern being spaced apart from and defining a perimeter around the second conductive connector.

12. The semiconductor device of claim 11, wherein the first and second shield patterns contact each other.

13. The semiconductor device of claim 11, wherein the first conductive connector contacts the second bonding layer, and the second conductive connector contacts the first bonding layer.

14. The semiconductor device of claim 11, wherein the first shield pattern comprises a plurality of first shield patterns spaced apart from each other in the first bonding layer and the first diffusion blocking layer, and the second shield pattern comprises a plurality of second shield patterns spaced apart from each other in the second bonding layer and the second diffusion blocking layer.

15. The semiconductor device of claim 14, wherein at least one of the plurality of first shield patterns and at least one of the plurality of second shield patterns contact each other.

16. A semiconductor device comprising:
a substrate;
a first conductive structure on the substrate;
a second conductive structure on the first conductive structure;
an insulating interlayer on a sidewall of the first conductive structure, the insulating interlayer including an oxide;
first and second metal-diffusion-blocking layers on respective sidewalls of the first and second conductive structures, the first and second metal-diffusion-blocking layers including a nitride, and the first metal-diffusion-blocking layer being on the insulating interlayer;
an insulating layer between the first and second metal-diffusion-blocking layers, the insulating layer including a nitride; and
a first metal-diffusion-shield pattern extending in both of the insulating layer and the first metal-diffusion-blocking layer, the first metal-diffusion-shield pattern being spaced apart from the first conductive structure.

17. The semiconductor device of claim 16,
wherein a portion of the insulating layer extends under a portion of the second conductive structure.

18. The semiconductor device of claim 17,
wherein the portion of the insulating layer is between the portion of the second conductive structure and a portion of the first metal-diffusion-blocking layer that extends under the portion of the second conductive structure, and
wherein a first width of the first conductive structure substantially equals a second width of the second conductive structure.

19. The semiconductor device of claim 18,
further comprising a second metal-diffusion-shield pattern that contacts a portion of the first metal-diffusion-shield pattern, the second metal-diffusion-shield pattern extending in both of the insulating layer and the second metal-diffusion-blocking layer,
wherein the first metal-diffusion-shield pattern and the second metal-diffusion-shield pattern comprise a nitride.

20. The semiconductor device of claim 16, wherein the first and second metal-diffusion-blocking layers include silicon nitride (SiN), and the insulating layer includes silicon carbonitride (SiCN).

* * * * *